(12) United States Patent
Kim et al.

(10) Patent No.: US 11,727,991 B2
(45) Date of Patent: Aug. 15, 2023

(54) CONDITIONALLY PRECHARGING WORDLINES BASED ON TEMPERATURE AND DURATION DEPENDENT VOLTAGE DROPS IN A STORAGE DEVICE

(71) Applicant: Samsung Electronics Co., Ltd., Suwon-si (KR)

(72) Inventors: Youhwan Kim, Ansan-si (KR); Kyungduk Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 94 days.

(21) Appl. No.: 17/378,202

(22) Filed: Jul. 16, 2021

(65) Prior Publication Data

US 2022/0199162 A1  Jun. 23, 2022

(30) Foreign Application Priority Data

Dec. 17, 2020  (KR) .................. 10-2020-0177720

(51) Int. Cl.
*G11C 16/26*  (2006.01)
*G06F 12/02*  (2006.01)
(Continued)

(52) U.S. Cl.
CPC .......... *G11C 16/08* (2013.01); *G06F 12/0238* (2013.01); *G11C 16/0483* (2013.01);
(Continued)

(58) Field of Classification Search
CPC ..... G11C 16/08; G11C 16/0483; G11C 16/26; G11C 16/32; G06F 12/0238;
(Continued)

(56) References Cited

U.S. PATENT DOCUMENTS 7,262,994 B2 *  8/2007  Fong .................. G11C 16/0483
                                                    365/189.05
7,480,178 B2 *  1/2009  Park .................... G11C 16/107
                                                    365/185.24
(Continued)

FOREIGN PATENT DOCUMENTS

CN  105047216 A  * 11/2015  ........... G06F 3/0616
CN  111916136 A  * 11/2020  ........... G06F 1/3206
(Continued)

OTHER PUBLICATIONS

Cai, Yu, et al. "Read disturb errors in MLC NAND flash memory: Characterization, mitigation, and recovery." 2015 45th Annual IEEE/IFIP International Conference on Dependable Systems and Networks. IEEE, 2015. (Year: 2015).*

(Continued)

*Primary Examiner* — Charles Rones
*Assistant Examiner* — Hewy H Li
(74) *Attorney, Agent, or Firm* — Muir Patent Law, PLLC

(57) ABSTRACT

An operating method of a storage device includes monitoring a temperature of a nonvolatile memory device including a plurality of memory blocks, receiving a first request from a host, in response to the first request, transmitting a first command to the nonvolatile memory device when a first memory block corresponding to the first request is exposed at a temperature of a threshold temperature or higher for a first time period that is equal to or greater than a threshold time period and a second command to the nonvolatile memory device when the first memory block is exposed at a temperature lower than the threshold temperature for the threshold time period, charging word lines of the first memory block with a driving voltage in response to the first command, and performing a first operation corresponding to
(Continued)

the first request in response to the first command or the second command.

20 Claims, 14 Drawing Sheets

(51) Int. Cl.
*G11C 16/32* (2006.01)
*G11C 16/08* (2006.01)
*G11C 16/04* (2006.01)

(52) U.S. Cl.
CPC ............... *G11C 16/26* (2013.01); *G11C 16/32* (2013.01); *G06F 2212/202* (2013.01)

(58) Field of Classification Search
CPC ........... G06F 2212/202; G06F 11/3055; G06F 11/3058; G06F 11/3003; G06F 11/3034; G06F 11/3037; G06F 3/0679; G06F 1/3203; G06F 1/30
See application file for complete search history.

(56) References Cited

U.S. PATENT DOCUMENTS

| | | | |
|---|---|---|---|
| 7,489,547 B2* | 2/2009 | Moogat | G11C 16/3418 365/185.17 |
| 7,495,992 B2 | 2/2009 | Pan | |
| 7,679,133 B2 | 3/2010 | Son et al. | |
| 8,130,556 B2* | 3/2012 | Lutze | G11C 16/10 365/230.01 |
| 8,385,118 B2 | 2/2013 | Yip | |
| 8,526,233 B2* | 9/2013 | Hemink | G11C 16/10 365/185.17 |
| 8,553,466 B2 | 10/2013 | Han et al. | |
| 8,559,235 B2* | 10/2013 | Yoon | G11C 16/16 365/185.29 |
| 8,644,075 B2 | 2/2014 | Hemink et al. | |
| 8,654,587 B2 | 2/2014 | Yoon et al. | |
| 8,902,669 B2 | 12/2014 | Yang et al. | |
| 8,988,939 B2 | 3/2015 | Dunga et al. | |
| 9,658,800 B2* | 5/2017 | Darragh | G11C 29/70 |
| 10,026,486 B1 | 7/2018 | Dutta et al. | |
| 10,210,941 B1 | 2/2019 | Chen et al. | |
| 10,475,493 B2 | 11/2019 | Sakai et al. | |
| 10,629,272 B1* | 4/2020 | Lu | G11C 16/0483 |
| 11,205,493 B1* | 12/2021 | Zainuddin | G11C 11/5671 |
| 2010/0318820 A1* | 12/2010 | Dickens | G06F 3/0625 713/320 |
| 2011/0233648 A1 | 9/2011 | Seol et al. | |

FOREIGN PATENT DOCUMENTS

| | | | |
|---|---|---|---|
| JP | 4059065 B2 | 3/2008 | |
| WO | WO-2017020973 A1 * | 2/2017 | ............. G01D 9/005 |

OTHER PUBLICATIONS

English Translation of CN105047216-A. (Year: 2015).*
English Translation of CN111916136-A. (Year: 2020).*
Nguyen, Hung T., et al. "Trade-off between sample size and accuracy: case of measurements under interval uncertainty." International Journal of Approximate Reasoning 50.8 (2009): 1164. (Year: 2009).*

* cited by examiner

CONDITIONALLY PRECHARGING WORDLINES BASED ON TEMPERATURE AND DURATION DEPENDENT VOLTAGE DROPS IN A STORAGE DEVICE

CROSS-REFERENCE TO RELATED APPLICATIONS

This application claims priority under 35 U.S.C. § 119 to Korean Patent Application No. 10-2020-0177720 filed on Dec. 17, 2020, in the Korean Intellectual Property Office, the disclosure of which is incorporated by reference herein in its entirety.

BACKGROUND

Embodiments of the present disclosure described herein relate to a semiconductor memory, and more particularly, relate to a storage device and an operating method thereof.

Nonvolatile memories include a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

Voltages may be applied to string selection lines, word lines, and ground selection lines to read data written in the nonvolatile memory. As the voltages are applied thereto, channels corresponding to string selection transistors, memory cells, and ground selection transistors may be formed. A discharged voltage level of the word line caused by a nonvolatile memory inactivity for a long time may increase error bits of the nonvolatile memory. Thus, the discharged voltage level of the word line may need to recover before a read operation to improve reliability of data of the nonvolatile memory.

SUMMARY

Embodiments of the present disclosure provide a storage device for preventing loss of stored data when a nonvolatile memory device is accessed and an operating method thereof.

According to an embodiment, an operating method of a storage device includes monitoring, by the storage device, a temperature of a nonvolatile memory device including a plurality of memory blocks, receiving, by the storage device, a first request from a host, in response to the first request, transmitting, by the storage device, a first command to the nonvolatile memory device when a first memory block corresponding to the first request from among the plurality of memory blocks is exposed at a temperature of a threshold temperature or higher for a first time period that is equal to or greater than a threshold time period and a second command to the nonvolatile memory device when the first memory block is exposed at a temperature lower than the threshold temperature for the threshold time period, charging, by the storage device, word lines of the first memory block with a driving voltage in response to the first command, and performing, by the storage device, a first operation corresponding to the first request in response to the first command or the second command.

According to an embodiment, an operating method of a storage device includes receiving, by the storage device, a first request from a host, interrupting, by the storage device, a power supplied to a nonvolatile memory device including a plurality of memory blocks in response to the first request, receiving, by the storage device, a second request from the host, supplying, by the storage device, the power to the nonvolatile memory device in response to the second request, in response to the second request, transmitting, by the storage device, a first command to the nonvolatile memory device when the power supplied to the nonvolatile memory device is interrupted for a first time period that is equal to or greater than a first threshold time period and a second command to the nonvolatile memory device when the power supplied to the nonvolatile memory device is interrupted for a time period less than the first threshold time period, charging, by the storage device, word lines of a first memory block from among the plurality of memory blocks with a driving voltage in response to the first command, and performing, by the storage device, an operation corresponding to the second request on the first memory block in response to the first command or the second command.

According to an embodiment, a storage device includes a nonvolatile memory device that includes a plurality of memory blocks, and a memory controller. The memory controller, in response to a first request received from a host, interrupt a power supplied to the nonvolatile memory device, and in response to a second request received from the host, transmits a first command to the nonvolatile memory device when the power supplied to the nonvolatile memory device is interrupted for a first time period that is equal to or greater than a first threshold time period, and a second command to the nonvolatile memory device when the power supplied to the nonvolatile memory device is interrupted for a time period less than the first threshold time period. The nonvolatile memory device charges word lines of a first memory block corresponding the second request with a driving voltage in response to the first command, and performs a first operation corresponding to the second request in response to the first command or the second command.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art easily carries out the present disclosure.

Hereinafter, embodiments of the present disclosure will be described in more detail with reference to accompanying drawings. In describing the present disclosure, to make the overall understanding easy, like components/elements will be marked by like reference signs/numerals in drawings, and thus, additional description will be omitted to avoid redundancy.

Figure 1:
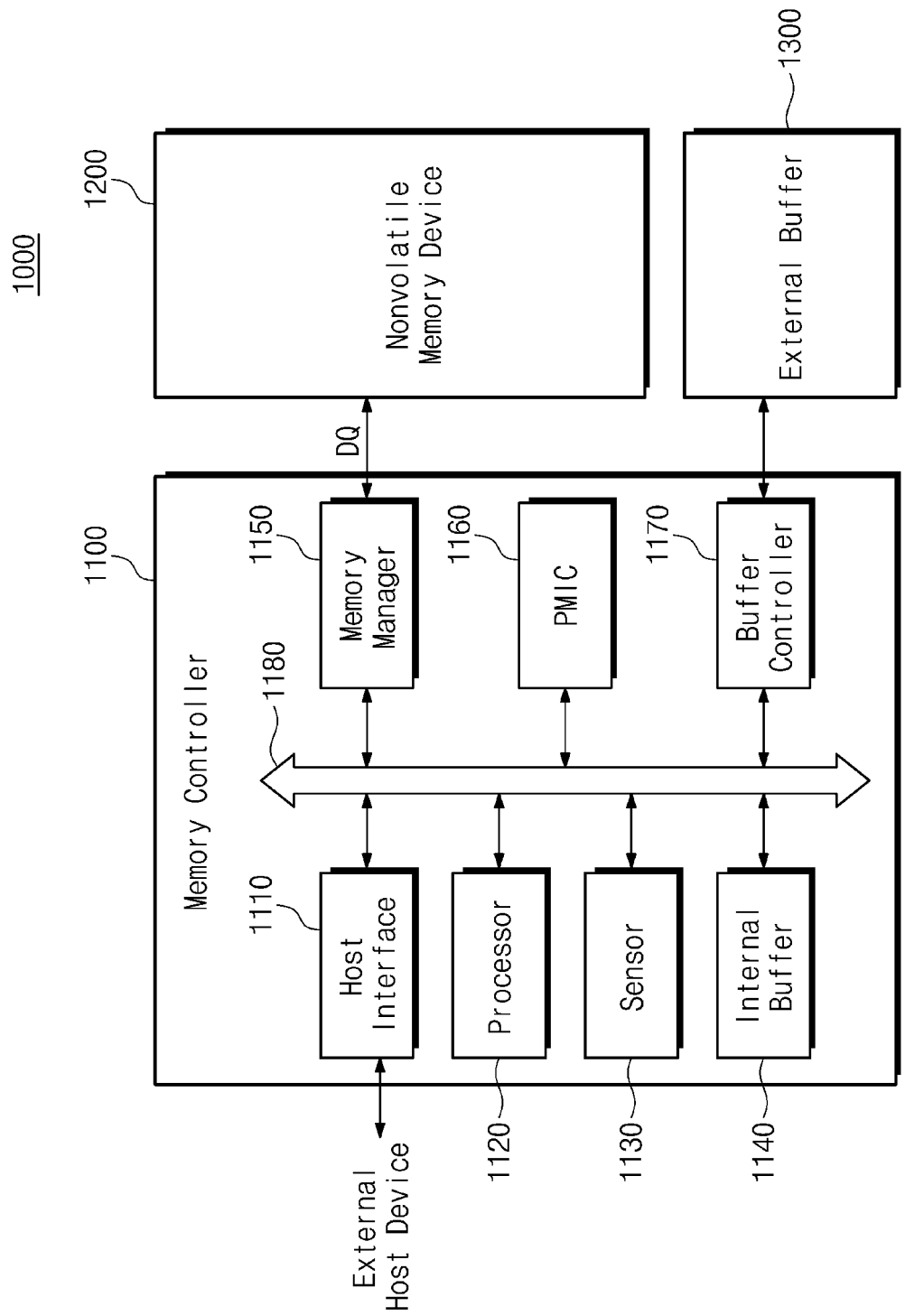
FIG. 1 is a block diagram of a storage device according to an embodiment of the present disclosure.

FIG. 1 is a block diagram of a storage device 1000 according to an embodiment of the present disclosure. Referring to FIG. 1, the storage device 1000 may include a memory controller 1100, a nonvolatile memory device 1200, and an external buffer 1300.

The memory controller 1100 may communicate with an external host (or an external host device) and the nonvolatile memory device 1200. The memory controller 1100 may receive various requests for writing data in the nonvolatile memory device 1200 or reading data from the nonvolatile memory device 1200 from the external host. The memory controller 1100 may control the nonvolatile memory device 1200 in response to a request of the external host. The memory controller 1100 may store data received from or to be transmitted to the external host and data for managing the storage device 1000 in the external buffer 1300.

The memory controller 1100 may include a host interface 1110, a processor 1120, a sensor 1130, an internal buffer 1140, a memory manager 1150, a power management integrated circuit (PMIC) 1160, and a buffer controller 1170. The components of the memory controller 1100 may communicate with each other through an internal bus 1180.

The host interface 1110 may receive requests including a command and an address from the external host. The host interface 1110 may transmit the received requests to the processor 1120. Data that are received from the external host through the host interface 1110 may be stored in the external buffer 1300 through the buffer controller 1170. The host interface 1110 may transmit data stored in the external buffer 1300 to the external host through the buffer controller 1170.

The processor 1120 may drive an operating system or firmware for driving the memory controller 1100. The processor 1120 may load metadata for controlling the nonvolatile memory device 1200 onto the internal buffer 1140 and may make reference to the metadata. The internal buffer 1140 may include a random access memory (RAM). For example, the internal buffer 1140 may include a static RAM (SRAM) or a dynamic RAM (DRAM).

In response to requests received from the external host and a temperature of the nonvolatile memory device 1200, the processor 1120 may generate various commands and addresses for controlling the nonvolatile memory device 1200. The processor 1120 may provide the generated commands and addresses to the memory manager 1150. Under control of the processor 1120, the memory manager 1150 may allow data stored in the internal buffer 1140 and the external buffer 1300 to be stored in the nonvolatile memory device 1200.

In some embodiments, the processor 1120 may perform a timer function for measuring a time associated with an operation of the nonvolatile memory device 1200. For example, the processor 1120 may measure a time by using a clock signal used within the memory controller 1100 or a clock signal received from the external host.

The sensor 1130 may measure a temperature (e.g., an operating temperature) of the storage device 1000. For example, the sensor 1130 may periodically monitor a temperature (e.g., an operating temperature) of the nonvolatile memory device 1200 or an ambient temperature of the nonvolatile memory device 1200. The sensor 1130 may provide the processor 1120 with information about the temperature of the nonvolatile memory device 1200 thus monitored.

The memory manager 1150 may communicate with the nonvolatile memory device 1200 through a data bus DQ under control of the processor 1120. The memory manager 1150 may transmit commands and addresses generated by the processor 1120, data stored in the internal buffer 1140, and data stored in the external buffer 1300 to the nonvolatile memory device 1200. The memory manager 1150 may receive data stored in the nonvolatile memory device 1200.

The PMIC 1160 may control a power of the storage device 1000 under control of the processor 1120. The PMIC 1160 may generate various levels of voltages or currents that are used within the storage device 1000. The PMIC 1160 may provide the generated voltages or currents to each component of the memory controller 1100, the nonvolatile memory device 1200, and the external buffer 1300.

In some embodiments, the PMIC 1160 may interrupt a power to the nonvolatile memory device 1200 (or power down the nonvolatile memory device 1200) for a given time in response to a request of the external host or under control of the memory controller 1100. The processor 1120 may count a time for which the power of the nonvolatile memory device 1200 is interrupted by the PMIC 1160.

Under control of the processor 1120, the buffer controller 1170 may write data in the external buffer 1300 or may read data from the external buffer 1300. The external buffer 1300 may include a DRAM, a phase change RAM (PRAM), a magnetic RAM (MRAM), a resistive RAM (RRAM), or the like.

Figure 2:
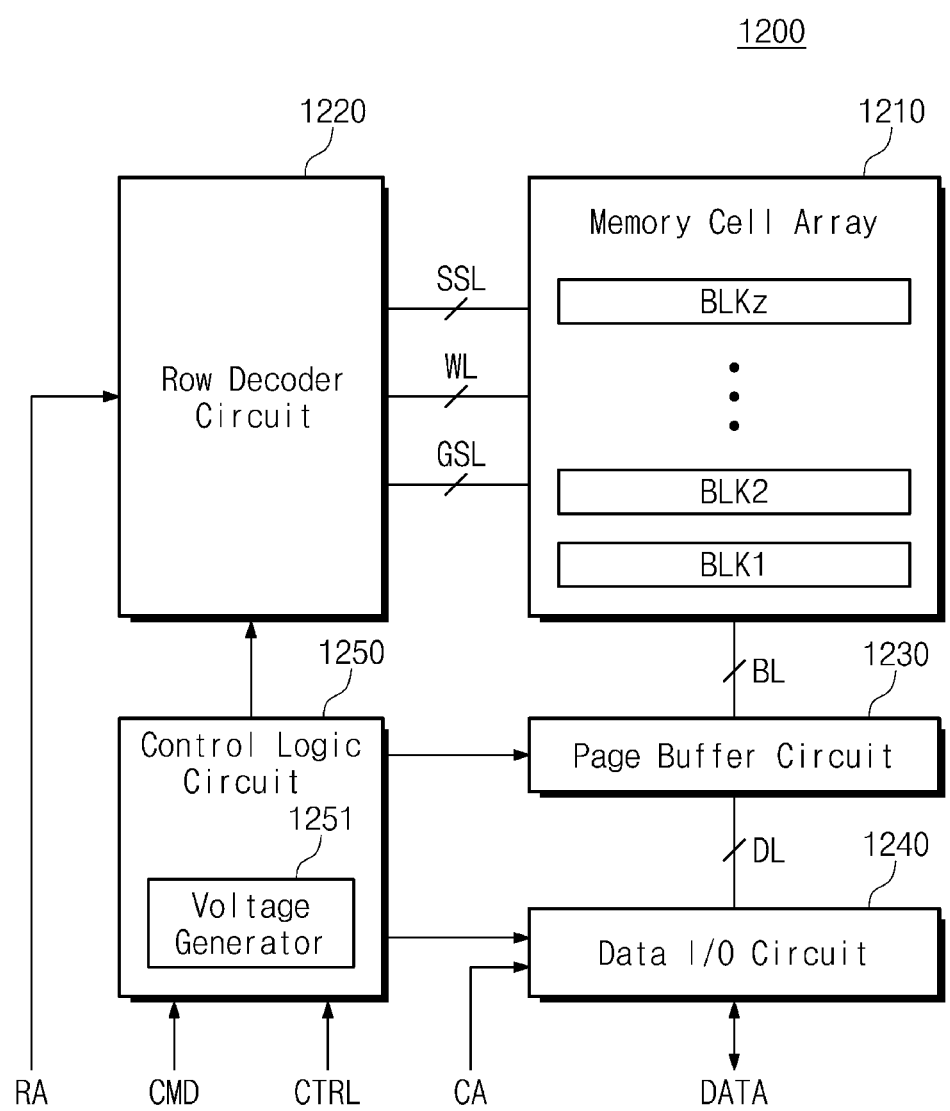
FIG. 2 is a block diagram illustrating a nonvolatile memory device of FIG. 1 according to example embodiments.

FIG. 2 is a block diagram illustrating a nonvolatile memory device of FIG. 1 according to example embodiments. Referring to FIGS. 1 and 2, the nonvolatile memory device 1200 may include a memory cell array 1210, a row decoder circuit 1220, a page buffer circuit 1230, a data input/output circuit 1240, and a control logic circuit 1250.

The memory cell array 1210 may include a plurality of memory blocks BLK1 to BLKz (z being a positive integer). Each of the plurality of memory blocks BLK1 to BLKz may include a plurality of memory cells. Each of the memory blocks BLK1 to BLKz may be connected to the row decoder circuit 1220 through one or more ground selection lines GSL, word lines WL, and one or more string selection lines SSL. Each of the memory blocks BLK1 to BLKz may be connected to the page buffer circuit 1230 through a plurality of bit lines BL. The memory blocks BLK1 to BLKz may be connected in common with the plurality of bit lines BL.

The row decoder circuit 1220 may be connected to the memory cell array 1210 through the string selection lines SSL, the word lines WL, and the ground selection lines GSL. The row decoder circuit 1220 may operate under control of the control logic circuit 1250.

The row decoder circuit 1220 may receive a row address RA provided from the memory controller 1100 and may decode the received row address RA. The row decoder circuit 1220 may select one of the word lines WL connected to the memory cell array 1210 based on the decoded row address. Under control of the control logic circuit 1250, the row decoder circuit 1220 may adjust voltages to be applied to the string selection lines SSL, the word lines WL, and the ground selection lines GSL based on the decoded row address.

The page buffer circuit 1230 may be connected to the memory cell array 1210 through the plurality of bit lines BL. The page buffer circuit 1230 may be connected to the data input/output circuit 1240 through data lines DL. The page buffer circuit 1230 may operate under control of the control logic circuit 1250.

In a write operation, the page buffer circuit 1230 may store data to be written in the memory cell array 1210. The page buffer circuit 1230 may apply voltages to the bit lines BL based on the stored data. In a read operation or in a verification read operation associated with the write operation or an erase operation, the page buffer circuit 1230 may sense voltages of the bit lines BL and may store a result of the sensing.

The data input/output circuit 1240 may be connected to the page buffer circuit 1230 through the data lines DL. The data input/output circuit 1240 may operate under control of the control logic circuit 1250. The data input/output circuit 1240 may receive a column address CA from the memory controller 1100. The data input/output circuit 1240 may output data read by the page buffer circuit 1230, based on the column address CA. The data input/output circuit 1240 may transmit data "DATA" received from the memory controller 1100 to the page buffer circuit 1230 through the data lines DL, based on the column address CA.

The control logic circuit 1250 may receive a command CMD from the memory controller 1100. The control logic circuit 1250 may exchange a control signal CTRL with the memory controller 1100. The control logic circuit 1250 may decode the received command CMD. The control logic circuit 1250 may control the row decoder circuit 1220, the page buffer circuit 1230, and the data input/output circuit 1240, based on the decoded command.

In some embodiments, in response to the decoded command, the control logic circuit 1250 may allow the row decoder circuit 1220 to apply a first voltage to at least a part of the word lines WL. For example, the control logic circuit 1250 may allow the row decoder circuit 1220 to apply the first voltage (e.g., a voltage VDD of FIG. 4A) to word lines corresponding to the row address RA. The first voltage may be greater than a ground voltage and may be smaller than a read pass voltage (e.g., a voltage VREAD of FIG. 4A) for turning on memory cells regardless of threshold voltages of the memory cells in the read operation. The first voltage may be referred to as a "driving voltage".

The control logic circuit 1250 may include a voltage generator 1251. The voltage generator 1251 may receive a reference voltage from an external device (e.g., the storage controller 1100). The voltage generator 1251 may generate various voltages necessary for a program operation, an erase operation, or a read operation of the nonvolatile memory device 1200, based on the reference voltage. The voltage generator 1251 may provide the generated voltages to the components of the nonvolatile memory device 1200.

In some embodiments, the sensor 1130 of FIG. 1 may be implemented within the nonvolatile memory device 1200. In this case, the sensor 1130 may periodically measure a temperature of the nonvolatile memory device 1200. The temperature of the nonvolatile memory device 1200 thus measured by the sensor 1130 may be provided to the memory controller 1100.

Figure 3:
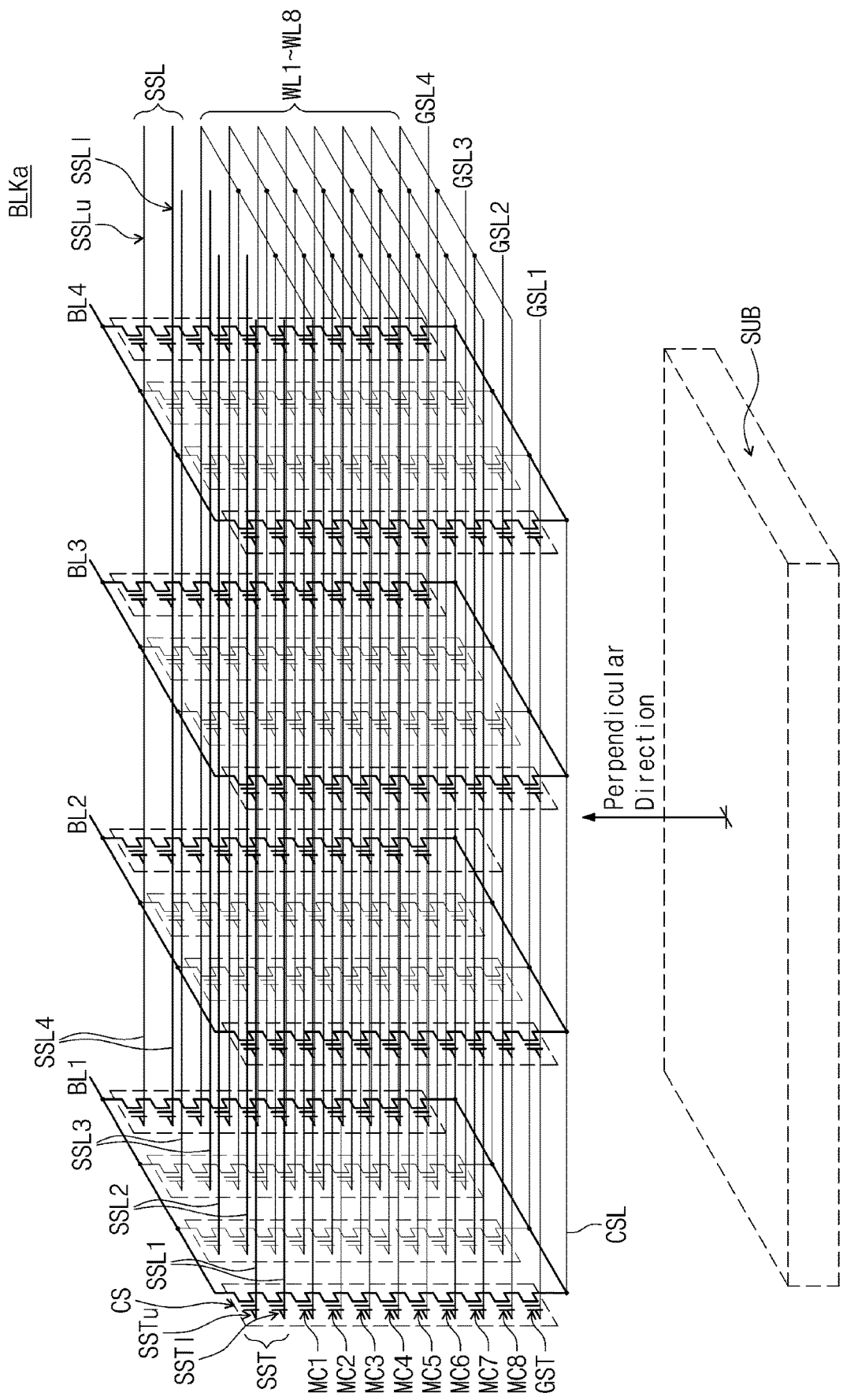
FIG. 3 is a circuit diagram illustrating one memory block of memory blocks of FIG. 2 according to example embodiments.

FIG. 3 is a circuit diagram illustrating an example of one memory block BLKa of the memory blocks BLK1 to BLKz of FIG. 2 according to example embodiments. Referring to FIG. 3, a plurality of cell strings CS may be arranged on a substrate SUB in rows and columns. The plurality of cell strings CS may be connected in common with a common source line CSL formed on (or in) the substrate SUB. For better understanding of a structure of the memory block BLKa, a location of the substrate SUB is illustrated in FIG. 3 by way of example.

An example is illustrated in FIG. 3 as the common source line CSL is connected to lower ends (or lower portions) of the cell strings CS. However, it is sufficient if the common source line CSL is electrically connected to the lower ends of the cell strings CS, and the present disclosure is not limited to the case that the common source line CSL is physically located at the lower ends of the cell strings CS. An example is illustrated in FIG. 3 as the cell strings CS are arranged in a four-by-four matrix. However, the number of cell strings CS in the memory block BLKa may increase or decrease.

The cell strings CS of each row may be connected in common with the ground selection line GSL and with a corresponding string selection line of first to fourth string selection lines SSL1 to SSL4. Cell strings of each column may be connected to a corresponding one of first to fourth bit lines BL1 to BL4. To prevent a drawing from being complicated, the cell strings CS connected to the second and third string selection lines SSL2 and SSL3 are depicted to be blurred.

Each of the cell string CS may include at least one ground selection transistor GST connected to the ground selection line GSL, a plurality of memory cells MCi to MC8 respectively connected to a plurality of word lines WL1 to WL8, and string selection transistors SST respectively connected to the string selection lines SSL1, SSL2, SSL3, or SSL4.

In each cell string CS, the ground selection transistor GST, the memory cells MCi to MC8, and the string selection transistors SST may be connected in series in a direction perpendicular to the substrate SUB and may be sequentially stacked in the direction perpendicular to the substrate SUB. In each cell string CS, at least one of the memory cells MCi to MC8 may be used as a dummy memory cell. The dummy memory cell may not be programmed (e.g., may be program-inhibited) or may be programmed differently from the remaining memory cells of the memory cells MCi to MC8.

In an embodiment, memory cells that are placed at the same height and are associated with the string selection lines SSL1, SSL2, SSL3, or SSL4 may form one physical page. Memory cells of one physical page may be connected to one sub-word line. Sub-word lines of physical pages positioned at the same height may be connected in common to one word line.

In an embodiment, sub-word lines of physical pages placed at the same height may be connected to each other at a height at which the sub-word lines are formed. For another example, sub-word lines of physical pages placed at the same height may be indirectly connected to each other in any other layer, which has a height different from a height at which the sub-word lines are formed, such as a metal layer.

Figure 4A:
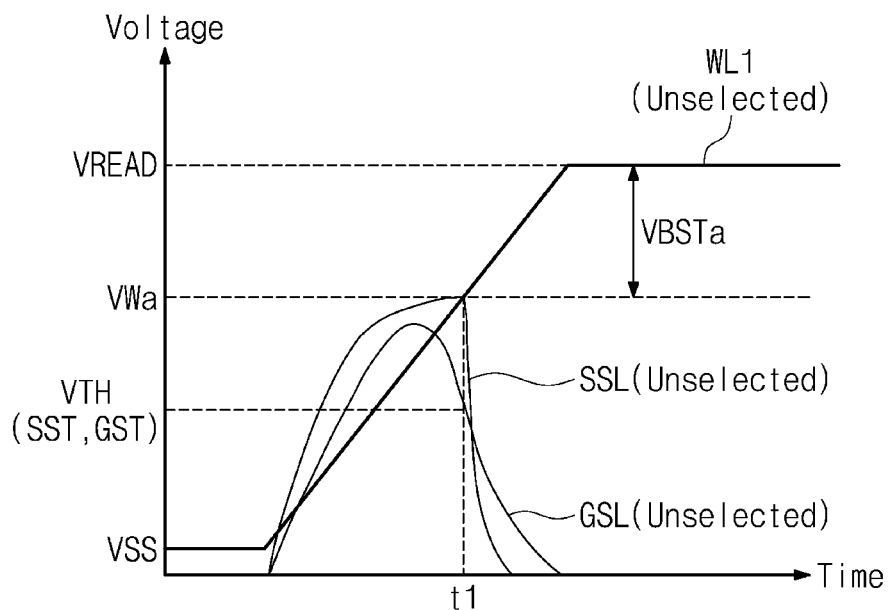
FIGS. 4A and 4B are graphs illustrating voltage changes of an unselected word line, an unselected string selection line, and an unselected ground selection line over time, according to example embodiments of the present disclosure.
Figure 4B:
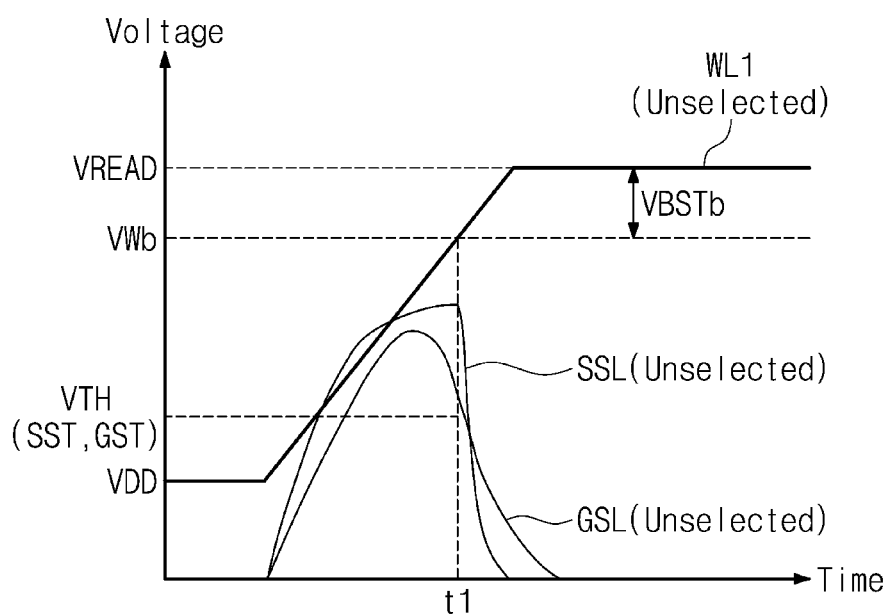

FIGS. 4A and 4B are graphs illustrating voltage changes of an unselected word line, an unselected string selection line, and an unselected ground selection line over time, according to example embodiments of the present disclosure. A read operation of the nonvolatile memory device 1200 will be described in detail with reference to FIGS. 1 to 3, 4A, and 4B.

A read request for memory cells connected to one (e.g., the word line WL3) of the word lines WL1 to WL8 of the memory block BLKa may be received from the external host. The memory controller 1100 may transmit the command CMD, the column address CA, and the row address RA, which correspond to the read request, to the nonvolatile memory device 1200 through the data bus DQ.

In response to the received command CMD, the control logic circuit 1250 may control the row decoder circuit 1220 such that a pre-pulse is applied to unselected string selection lines of the string selection lines SSL and unselected ground selection lines of the ground selection lines GSL. In the embodiment illustrated in FIGS. 4A and 4B, a peak voltage of the pre-pulse applied to the unselected string selection lines may be greater than a threshold voltage VTH of the string selection transistor SST, and a peak voltage of the pre-pulse applied to the unselected ground selection lines may be greater than a threshold voltage VTH of the ground selection transistor GST. As such, before voltages for performing the read operation are applied to the word lines WL1 to WL8, the unselected string selection transistors and the unselected ground selection transistors may be turned on for a given time. In this case, channels corresponding to the applied pre-pulse may be formed at the unselected string selection transistors and the unselected ground selection transistors.

While the pre-pulses are respectively applied to the unselected string selection lines and the unselected ground selection lines, the voltage VREAD may be applied to unselected word lines (e.g., WL1) of the word lines WL1 to WL8. In the embodiment illustrated in FIG. 4A, the word line WL1 may have an initial voltage corresponding to a voltage VSS. The voltage VSS may be the same as a ground voltage or may be a voltage close to the ground voltage. A voltage of the word line WL1 may gradually increase from the voltage VSS to the voltage VREAD. As such, a memory cell corresponding to the word line WL1 may be turned on. The voltage VREAD may be a voltage high enough to turn on a memory cell regardless of a program state of the memory cell.

When a voltage level of the pre-pulse is higher than the threshold voltages VTH of the unselected string selection transistors and the unselected ground selection transistors, the unselected string selection transistors and the unselected ground selection transistors may be turned on. Memory cells connected to the unselected word lines may be turned on by voltages of the unselected word lines, which are increasing to the voltage VREAD. As such, a specific voltage, for example, the ground voltage may be supplied to channels of memory cells connected to an unselected word line through the unselected string selection transistors from the bit lines BL, and the specific voltage, for example, the ground voltage may be supplied to channels of memory cells connected to an unselected word line through the unselected ground selection transistors from the common source line CSL. For example, voltages of the channels of the memory cells connected to the unselected word lines may be equalized and initialized.

The pre-pulse applied to the unselected string selection lines may have a peak voltage at a time point t1. At the time point t1, the word line WL1 may be of a voltage VWa. The voltage VWa may be greater than a threshold voltage of a memory cell. Afterwards, a voltage level of the pre-pulse may decrease, and the unselected string selection transistors and the unselected ground selection transistors may be turned off. As the unselected string selection transistors and the unselected ground selection transistors are turned off, the channels of the memory cells connected to the unselected word line may be floated. A voltage of the word line WL1 may increase up to the voltage VREAD. Voltages of the channels of the memory cells connected to the unselected word line may be boosted by a charge boosting voltage VBSTa being a difference between the read voltage VREAD and the voltage VWa. Hot carriers may be generated by a difference between the boosted voltages of the channels and the ground voltage of a bit line or a difference between the boosted voltages of the channels and the ground voltage of the common source line CSL. In this case, an unselected memory cell adjacent to a selected memory cell may be programmed by the hot carrier injection (i.e., an unintended program operation may be performed). Due to the unintended program operation, data stored in the unselected memory cell may be lost.

In the embodiment illustrated in FIG. 4B, the word line WL1 may have an initial voltage corresponding to the driving voltage VDD. The driving voltage VDD may be, for example, a power supply voltage that is supplied to various circuits of the nonvolatile memory device 1200 such as the row decoder circuit 1220, the page buffer circuit 1230, the data input/output circuit 1240, and the control logic circuit 1250. A voltage of the word line WL1 may increase with a slope that is the same as a slope of the voltage of the word line WL1 described with reference to FIG. 4A.

Unlike the embodiment illustrated in FIG. 4A, in the embodiment illustrated in FIG. 4B, the word line WL1 may have a voltage VWb at the time point t1. Because the driving voltage VDD may be greater than the voltage VSS, the voltage VWb at the time point t1 of FIG. 4B may be greater than the voltage VWa at the time point t1 of FIG. 4A. Accordingly, a boosting voltage VBSTb being a difference between the voltage VREAD and the voltage VWb may be smaller than the boosting voltage VBSTa of FIG. 4A. As such, the influence of the hot electron injection may decrease, and thus, the loss of data stored in an unselected memory cell adjacent to a selected memory cell may be prevented.

In some embodiments, the storage device 1000 may first charge word lines of a memory block to be accessed from among memory blocks of the nonvolatile memory device 1200 with the driving voltage VDD and may then access data stored in the memory block. As such, the loss of data due to the hot carrier injection may be prevented. This may mean that the reliability of the storage device 1000 and the accuracy of the read operation are improved.

Figure 5A:
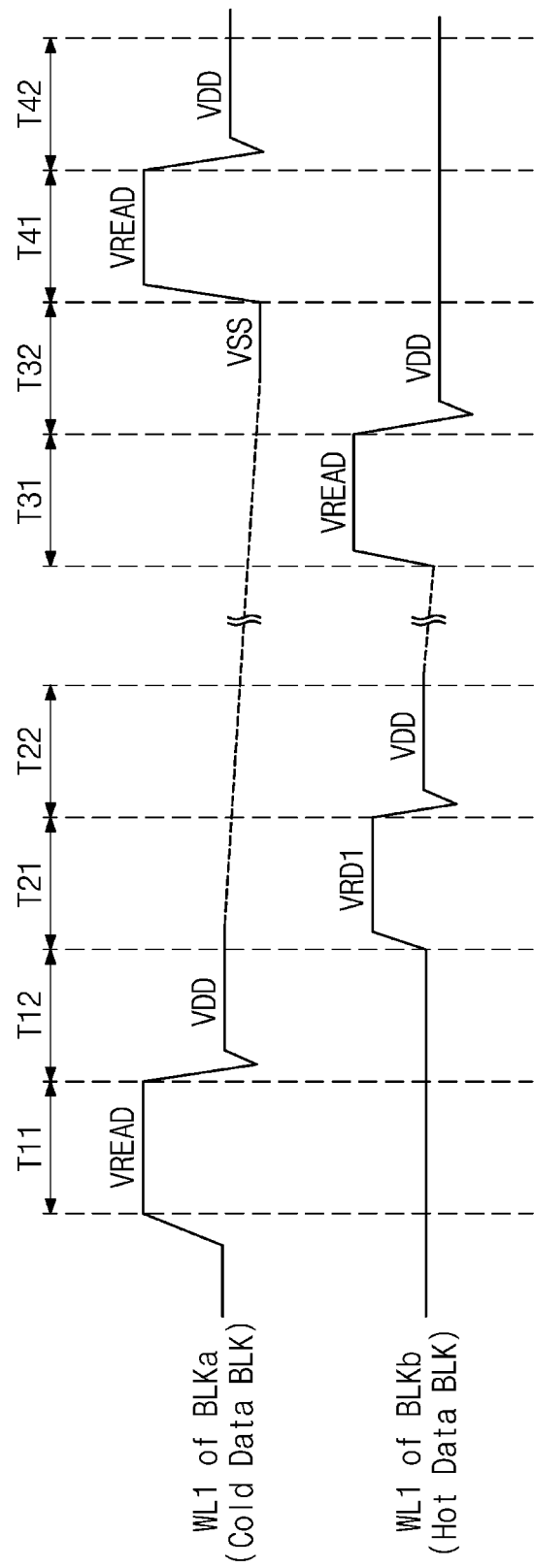
FIG. 5A is a graph illustrating voltage changes of some word lines over time, according to an embodiment of the present disclosure.

FIG. 5A is a graph illustrating voltage changes of some word lines over time, according to an embodiment of the present disclosure. Voltage changes of the word line WL1 of the memory block BLKa and the word line WL1 of the memory block BLKb according to the execution of the read operation of the nonvolatile memory device 1200 will be described with reference to FIGS. 1 to 3 and 5A.

In the embodiment illustrated in FIG. 5A, the memory block BLKa may be accessed by the external host at a relatively low frequency, and the memory block BLKb may be accessed by the external host at a relatively high frequency. The memory block BLKa may be understood as a block storing cold data, and the memory block BLKb may be understood as a block storing hot data. For convenience of illustration, an example is illustrated as the read operation is performed by using one read voltage VRD1, but the present disclosure is not limited thereto. For example, the memory blocks BLKa and BLKb may include various memory cells, such as a multi-level cell (MLC) and a triple level cell (TLC), as well as a single level cell (SLC) thus, the read voltage VRD1 may vary.

In time periods T11 and T12, data stored in the memory block BLKa may be read. The word line WL1 of the memory block BLKa may be an unselected word line. In the time period T11, the voltage VREAD may be applied to the word line WL1 of the memory block BLKa. In the time period T11, an appropriate read voltage may be applied to a selected word line, and thus, a voltage corresponding to data stored in a target memory cell may be sensed by the page buffer circuit 1230. In the time period T12, voltages applied to the word lines of the memory block BLKa may be discharged to the ground voltage or a voltage close thereto. Afterwards, the driving voltage VDD may be applied to the word lines of the memory block BLKa.

In time periods T21 and T22, data stored in the memory block BLKb may be read. The word line WL1 of the memory block BLKb may be a selected word line. In the time period T21, the read voltage VRD1 may be applied to the word line WL1 of the memory block BLKb. As the read voltage VRD1 is applied thereto, a voltage corresponding to data stored in each memory cell connected to the word line WL1 of the memory block BLKb may be sensed by the page buffer circuit 1230. In the time period T22, voltages applied to the word lines of the memory block BLKb may be discharged to the ground voltage or a voltage close thereto. Afterwards, the driving voltage VDD may be applied to the word lines of the memory block BLKb.

After the read operation is performed, the driving voltage VDD charged to the word lines may be discharged over time. For example, as a temperature becomes higher, the driving voltage VDD charged to the word lines may be discharged more quickly. As a voltage of a specific word line is more discharged and becomes closer to the ground voltage, as described with reference to FIG. 4A, the accuracy of the read operation may decrease.

The driving voltage VDD charged to word lines of a memory block accessed at a low frequency may be more discharged. In the embodiment illustrated in FIG. 5A, the memory block BLKa storing cold data may be accessed at a lower frequency than the memory block BLKb storing hot data. As such, after the word line WL1 of the memory block BLKa is charged with the driving voltage VDD in the time period T12, the memory block BLKa may be left alone for a long time. On the other hand, after the word line WL1 of the memory block BLKb is charged with the driving voltage VDD in the time period T22, the memory block BLKb may again be accessed in a time period T31.

In the time period T31, to read data stored in the memory block BLKb, the voltage VREAD may be applied to the word line WL1 of the memory block BLKb. In this case, the word line WL1 of the memory block BLKb may be an unselected word line. As the memory block BLKb is accessed at a high frequency, the word line WL1 of the memory block BLKb charged with the driving voltage VDD may be less discharged. Accordingly, even though the voltage VREAD is applied to the word line WL1 of the memory block BLKb in the time period T31, the accuracy of the read operation may not decrease. In the time period T32, a voltage applied to the word line WL1 of the memory block BLKb may be discharged to the ground voltage or a voltage close thereto and may then be charged with the driving voltage VDD.

In time periods T41 and T42, data stored in the memory block BLKa may be read. Because the memory block BLKa is not accessed for a long time, at the beginning of the time period T41, a voltage of the word line WL1 of the memory block BLKa may be discharged to the ground voltage or a voltage close thereto. As the voltage VREAD of a high level is applied to the word line WL1 of the memory block BLKa being an unselected word line, the hot electron injection may occur due to the mechanism described with reference to FIG. 4A. In this case, in the read operation performed in the time periods T41 and T42, threshold voltages of memory cells may increase due to an unintended program operation, thereby causing an increase of an error rate of data and the loss of data.

Figure 5B:
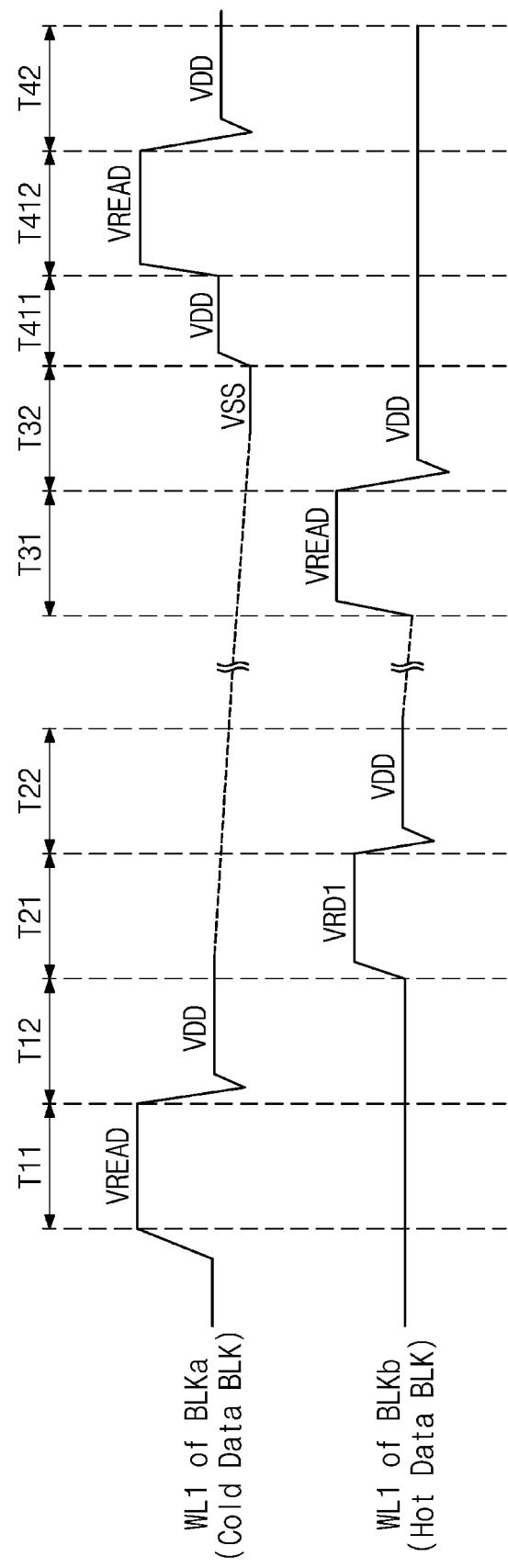
FIG. 5B is a graph illustrating voltage changes of some word lines over time, according to another embodiment of the present disclosure.

FIG. 5B is a graph illustrating voltage changes of some word lines over time, according to another embodiment of the present disclosure. A difference between the embodiment of FIG. 5A and the embodiment illustrated in FIG. 5B will be described with reference to FIGS. 1 to 3, 5A, and 5B.

In time periods T411, T412, and T42, data stored in the memory block BLKa may be read. As in the embodiment illustrated in FIG. 5A, at the beginning of the time period T411, a voltage of the word line WL1 of the memory block BLKa may have been discharged to the voltage VSS. In the time period T411, the word line WL1 of the memory block BLKa may be first charged with the driving voltage VDD. Afterwards, in the time period T412, the voltage VREAD may be applied to the word line WL1 of the memory block BLKa. Accordingly, unlike the time period T41 of FIG. 5A, in the time period T411, as the word line WL1 of the memory block BLKa is first charged with the driving voltage VDD, in the read operation, an increase of threshold voltages of memory cells due to an unintended program operation may be prevented, and the reliability of data may be guaranteed.

In some embodiments, while the memory block BLKa is not accessed, a temperature of the nonvolatile memory device 1200 may be maintained at a threshold temperature or higher for a time period longer than a second threshold time period. In this case, a flag of a first value (e.g., a value corresponding to logic "1") may be set to the memory block BLKa. The set flag may be stored in the nonvolatile memory device 1200. When a request for data stored in the memory block BLKa is received from the external host, the memory controller 1100 may check the flag of the memory block BLKa. Based on that the flag of the memory block BLKa is set to the first value, the memory controller 1100 may allow the nonvolatile memory device 1200 to first charge the word lines WL1 to WL8 of the memory block BLKa with the driving voltage VDD and to then perform the read operation. For example, the memory controller 1100 may allow the nonvolatile memory device 1200 to first charge all or at least a portion of the word lines (e.g., unselected word lines and a selected word line, or at least one of them) of the memory block BLKa with the driving voltage VDD, in advance of performing the read operation.

In the embodiment illustrated in FIG. 5B, the execution of the read operation is shown by ways of example, but the present disclosure is not limited thereto. For example, when a write request is received from the external host, the memory controller 1100 may check the flag of the memory block BLKa corresponding to the write request. Based on that the flag of the memory block BLKa is set to the first value, the memory controller 1100 may allow the nonvolatile memory device 1200 to first charge the word lines WL1 to WL8 of the memory block BLKa with the driving voltage VDD and to then apply voltages for the write operation to the word lines WL1 to WL8 of the memory block BLKa.

For another example, when a request for erasing the memory block BLKa is received from the external host, based on that the flag of the memory block BLKa is set to the first value, the memory controller 1100 may allow the nonvolatile memory device 1200 to first charge the word lines WL1 to WL8 of the memory block BLKa with the driving voltage VDD and to then perform the erase operation on the memory block BLKa.

Figure 6A:
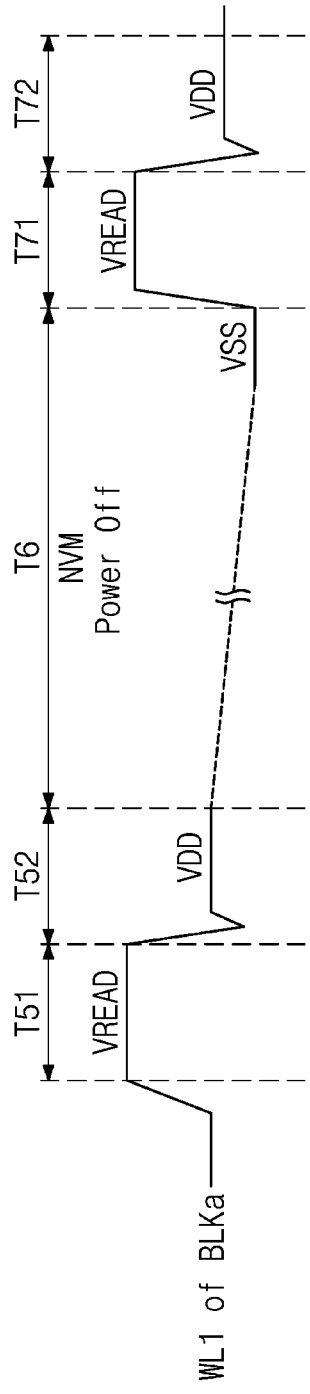
FIG. 6A is a graph illustrating a voltage change of an unselected word line of a memory block over time, according to another embodiment of the present disclosure.

FIG. 6A is a graph illustrating a voltage change of the word line WL1 of the memory block BLKa over time, according to another embodiment of the present disclosure. How a voltage of the word line WL1 of the memory block BLKa being an unselected word line changes over time in the case where data stored in the memory block BLKa are read will be described with reference to FIGS. 1 to 3 and 6A.

In time periods T51 and T52, data stored in the memory block BLKa may be read. In the time period T51, the voltage VREAD may be applied to the word line WL1 of the memory block BLKa. In the time period T51, an appropriate read voltage may be applied to a selected word line, and thus, a voltage corresponding to data stored in a target memory cell may be sensed by the page buffer circuit 1230. In the time period T52, voltages applied to word lines of the memory block BLKa including the word line WL1 may be discharged to the ground voltage or a voltage close thereto. Afterwards, the driving voltage VDD may be applied to the word lines of the memory block BLKa. For example, the word line WL1 of the memory block BLKa may be charged with the driving voltage VDD.

In a time period T6, a power of the nonvolatile memory device 1200 may be turned off (or interrupted). The memory controller 1100 may receive, for example, a request for interrupting a power of the nonvolatile memory device 1200 from the external host. In response to the received request, the PMIC 1160 of the memory controller 1100 may temporarily interrupt a power supplied to the nonvolatile memory device 1200. As the power of the nonvolatile memory device 1200 is interrupted for a long time, the voltage VDD charged to the word line WL1 of the memory block BLKa may be discharged to the voltage VSS.

In time periods T71 and T22, data stored in the memory block BLKa may be read. The memory controller 1100 may receive an access request for data stored in the memory block BLKa from the external host. In response to the received request, the memory controller 1100 may again supply a power to the nonvolatile memory device 1200 and may allow the nonvolatile memory device 1200 to perform the read operation on the requested data. As such, in the time period T71, the voltage VREAD may be applied to the word line WL1 of the memory block BLKa being an unselected word line. As a voltage of the word line WL1 of the memory block BLKa is discharged to the voltage VSS in the time period T6, the accuracy of the read operation associated with the memory block BLKa in the time period T71 may decrease as described with reference to FIG. 4A. In the time period T72, voltages of the word lines of the memory block BLKa may be discharged to the ground voltage or a voltage close thereto and may then be charged with the driving voltage VDD.

Figure 6B:
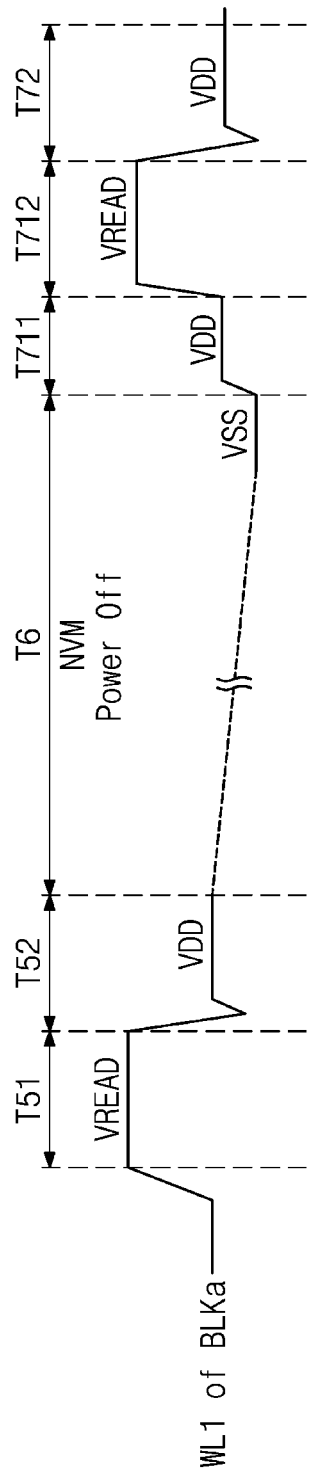
FIG. 6B is a graph illustrating a voltage change of an unselected word line of a memory block over time, according to another embodiment of the present disclosure.

FIG. 6B is a graph illustrating a voltage change of the word line WL1 of the memory block BLKa over time, according to another embodiment of the present disclosure. A difference between the embodiment of FIG. 6A and the embodiment illustrated in FIG. 6B will be described with reference to FIGS. 1 to 3, 6A, and 6B. Unlike the embodiment illustrated in FIG. 6A, in the embodiment illustrated in FIG. 6B, the memory controller 1100 may measure a length of a time when a power of the nonvolatile memory device 1200 is interrupted, that is, a length of the time period T6. In time periods T711, T712, and T72, data stored in the memory block BLKa may be read. As in the embodiment illustrated in FIG. 6A, at the beginning of the time period T711, a voltage of the word line WL1 of the memory block BLKa may have been discharged to the voltage VSS. In the time period T711, in response to that the time period (i.e., the length of the time period T6) for which the power of the nonvolatile memory device 1200 is interrupted is equal to or longer than a first threshold time period, the word line WL1 of the memory block BLKa may be first charged with the driving voltage VDD. Afterwards, in the time period T712, the voltage VREAD may be applied to the word line WL1 of the memory block BLKa. Accordingly, unlike the time period T71 of FIG. 6A, in the time period T711, as the word line WL1 of the memory block BLKa is first charged with the driving voltage VDD, the reliability of the read operation may be guaranteed.

In some embodiments, in the case where a power is not supplied to the nonvolatile memory device 1200 for the first threshold time period or longer and then is again supplied to the nonvolatile memory device 1200, and a temperature of the nonvolatile memory device 1200 may be equal to or higher than a threshold temperature. Under this condition, when a request for data stored in the memory block BLKa is received from the external host, the memory controller 1100 may first charge word lines of a part of the memory blocks BLK1 to BLKz of the nonvolatile memory device 1200 with the driving voltage VDD and may then allow the nonvolatile memory device 1200 to perform the read operation.

In some embodiments, the first threshold time period of the interrupted power may vary depend on the temperature of the nonvolatile memory device 1200. For example, for a relatively high temperature of the nonvolatile memory device 1200, the first threshold time period may be short and for a relatively low temperature of the nonvolatile memory device 1200, the first threshold time period may be long.

In example embodiments, in response to the request for data stored in the memory block BLKa received from the external host, the memory controller 1100 may prioritize at least a part of the memory blocks BLK1 to BLKz of the nonvolatile memory device 1200. Word lines of the prioritized memory block(s) may be first charged with the driving voltage VDD.

For example, the memory controller 1100 may allow the nonvolatile memory device 1200 to charge the word lines of the prioritized memory block(s) with the driving voltage VDD (e.g., the time period T711), to respectively apply voltages necessary to perform the request received from the external host to the word lines WL1 to WL8 of the memory block BLKa (e.g., the time period T712), to discharge voltages of the word lines WL1 to WL8 of the memory block BLKa to a voltage close to the ground voltage, to charge the word lines WL1 to WL8 of the memory block BLKa with the driving voltage VDD, and then (or substantially simultaneously) to charge word lines of a normal memory block(s), which is not prioritized, with the driving voltage VDD.

In the embodiment illustrated in FIG. 6B, the execution of the read operation is shown by ways of example, but the present disclosure is not limited thereto. For example, when a request for writing data is received from the external host, the memory controller 1100 may check a length of a time period when a power of the nonvolatile memory device 1200 is interrupted and a temperature of the nonvolatile memory device 1200. The memory controller 1100 may prioritize the memory block BLKa corresponding to the received write request and may allow the nonvolatile memory device 1200 to charge the word lines WL1 to WL8 of the memory block BLKa with the driving voltage VDD and to apply voltages for the write operation to the word lines WL1 to WL8 of the memory block BLKa.

For another example, when a request for erasing the memory block BLKa is received from the external host, the memory controller 1100 may prioritize the memory block BLKa and may allow the nonvolatile memory device 1200 to first charge the word lines WL1 to WL8 of the memory block BLKa with the driving voltage VDD and to perform the erase operation on the memory block BLKa.

Figure 7:
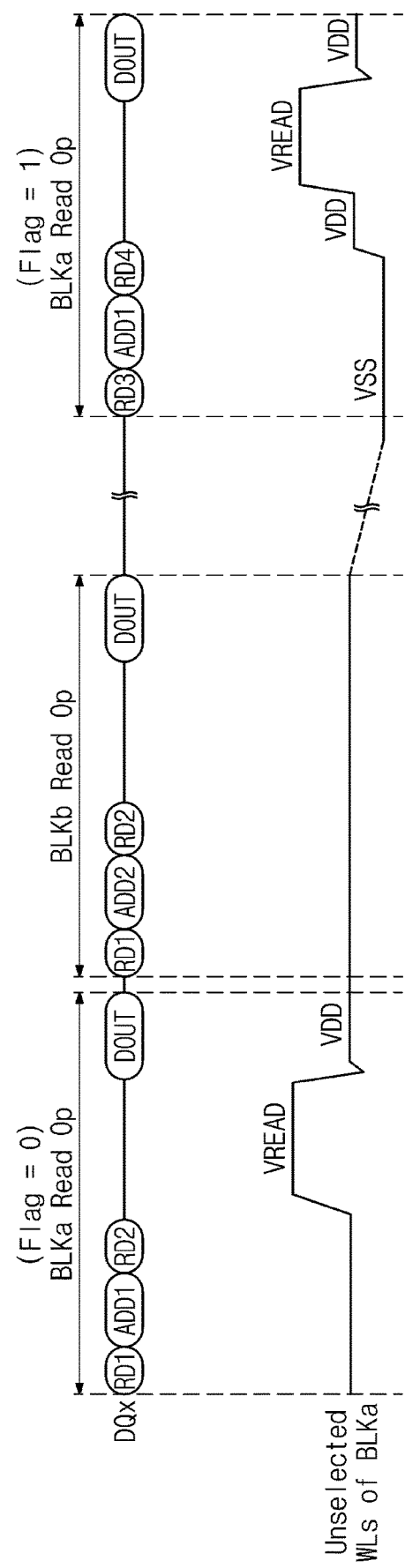
FIG. 7 is a timing diagram illustrating an operation of a storage device of FIG. 1, according to an embodiment of the present disclosure.

FIG. 7 is a timing diagram illustrating an operation of a storage device of FIG. 1, according to an embodiment of the present disclosure. Signals transmitted to a data bus DQx between the memory controller 1100 and the nonvolatile memory device 1200 of FIG. 1 and a voltage change of unselected word lines of the memory block BLKa will be described with reference to FIGS. 1 to 3, 5B, and 7.

The memory controller 1100 may transmit a read command RD1, an address ADD1, and a read command RD2 to the nonvolatile memory device 1200 through the data bus DQx. The address ADD1 may include a column address CA and a row address RA of data to be read. The nonvolatile memory device 1200 may perform the read operation on the memory block BLKa in response to the read commands RD1 and RD2 and the address ADD1. For example, based on that the flag of the memory block BLKa is set to a second value (e.g., a value corresponding to logic "0"), the voltage VREAD may be applied to unselected word lines of the memory block BLKa without first charging the unselected word lines with the driving voltage VDD.

The nonvolatile memory device 1200 may sense a voltage(s) corresponding to data stored in a memory cell(s) corresponding to the address ADD1 received from the memory controller 1100 and may provide output data DOUT to the memory controller 1100 through the data bus DQx based on a sensing result. Substantially simultaneously, the nonvolatile memory device 1200 may discharge voltages of the word lines of the memory block BLKa to the ground voltage or a voltage close thereto and may charge the word lines of the memory block BLKa with the driving voltage VDD.

The memory controller 1100 may transmit the read command RD1, an address ADD2, and the read command RD2 to the nonvolatile memory device 1200 through the data bus DQx. The nonvolatile memory device 1200 may perform the read operation on the memory block BLKb in response to the read commands RD1 and RD2 and the address ADD2.

After a given time passes, the memory controller 1100 may transmit a read command RD3, the address ADD1, and a read command RD4 to the nonvolatile memory device 1200 through the data bus DQx. The read command RD3 may be different from the read command RD1, and the read command RD4 may be the same as or different from the read command RD2. The read command RD3 and the read command RD4 may be based on that the flag of the memory block BLKa is set to the first value.

The nonvolatile memory device 1200 may perform the read operation on the memory block BLKa in response to the read commands RD3 and RD4 and the address ADD1. For example, based on that the flag of the memory block BLKa is set to the first value, the driving voltage VDD may be applied to the word lines of the memory block BLKa. Afterwards, voltages for performing the read operation may be respectively applied to the word lines of the memory block BLKa. For example, the voltage VREAD may be applied to unselected word lines of the memory block BLKa.

The nonvolatile memory device 1200 may sense a voltage(s) corresponding to data stored in a memory cell(s) corresponding to the address ADD1 received from the memory controller 1100 and may provide the output data DOUT to the memory controller 1100 through the data bus DQx based on a sensing result. Substantially simultaneously, the nonvolatile memory device 1200 may discharge voltages of the word lines of the memory block BLKa to the ground voltage or a voltage close thereto and may charge the word lines of the memory block BLKa with the driving voltage VDD.

Figure 8:
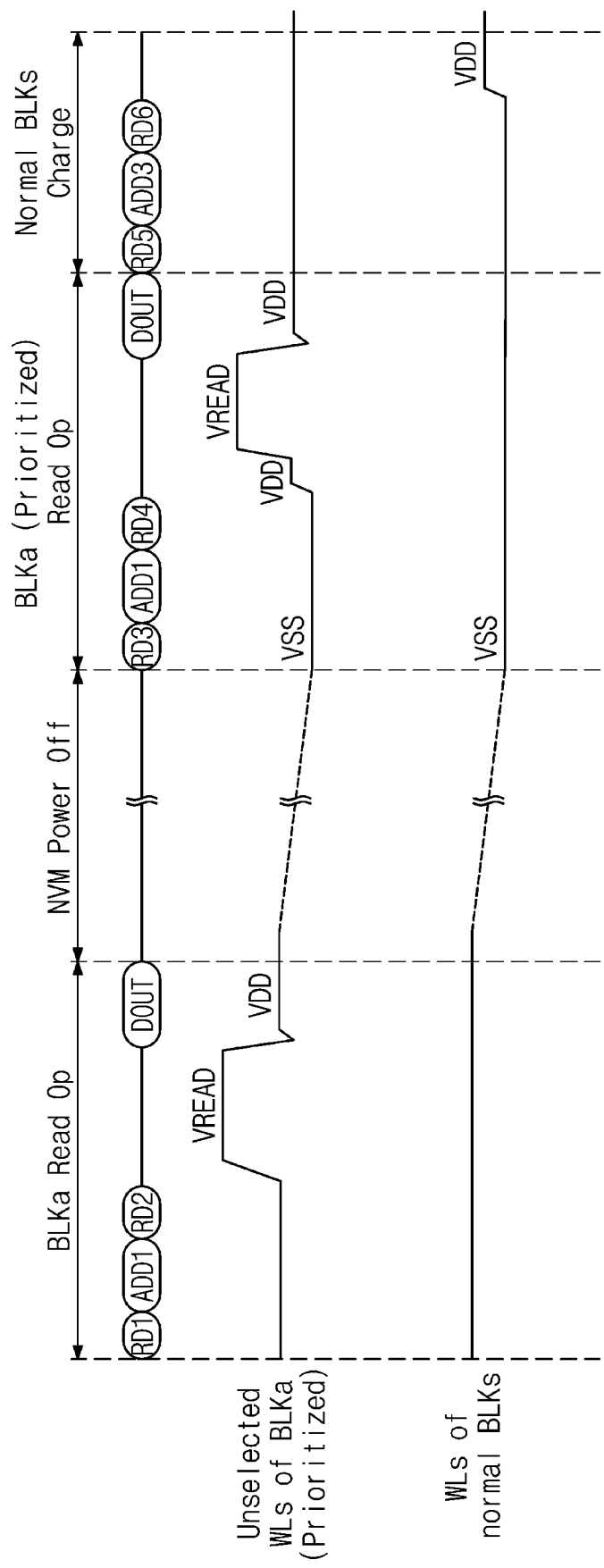
FIG. 8 is a timing diagram illustrating an operation of a storage device of FIG. 1, according to another embodiment of the present disclosure.

FIG. 8 is a timing diagram illustrating an operation of a storage device of FIG. 1, according to another embodiment of the present disclosure. A signal transmitted to the data bus DQx between the memory controller 1100 and the nonvolatile memory device 1200 of FIG. 1 and voltage changes of unselected word lines of the memory block BLKa and word lines of normal memory blocks which are not prioritized will be described with reference to FIGS. 1 to 3, 6B, and 8.

The memory controller 1100 may transmit the read command RD1, the address ADD1, and the read command RD2 to the nonvolatile memory device 1200 through the data bus DQx. The nonvolatile memory device 1200 may perform the read operation on the memory block BLKa in response to the read commands RD1 and RD2 and the address ADD1. For example, based on that the flag of the memory block BLKa is set to the second value, the voltage VREAD may be applied to unselected word lines of the memory block BLKa without first charging the unselected word lines with the driving voltage VDD. As in the above manner described with reference to FIG. 7, the nonvolatile memory device 1200 may provide, through the data bus DQx, the memory controller 1100 with the output data DOUT that are based on data stored in a memory cell(s) corresponding to the address ADD1 received from the memory controller 1100. Substantially simultaneously, the nonvolatile memory device 1200 may discharge voltages of the word lines of the memory block BLKa to the ground voltage or a voltage close thereto and may charge the word lines of the memory block BLKa with the driving voltage VDD.

After the nonvolatile memory device 1200 performs the read operation on the memory block BLKa, a power of the nonvolatile memory device 1200 may be interrupted depending on a request of the external host or the memory controller 1100.

The memory controller 1100 may receive a read request for data stored in the memory block BLKa from the external host. As such, the memory controller 1100 may again supply a power to the nonvolatile memory device 1200. In the case where a temperature of the nonvolatile memory device 1200 is equal to or higher than a threshold temperature and a time period for which the power of the nonvolatile memory device 1200 is interrupted is equal to or longer than a first threshold time period, the memory controller 1100 may prioritize the memory block BLKa being a memory block targeted for the read operation. The memory controller 1100 may transmit the read command RD3, the address ADD1, and the read command RD4 to the nonvolatile memory device 1200 through the data bus DQx. The nonvolatile memory device 1200 may perform the read operation on the memory block BLKa in response to the read commands RD3 and RD4 and the address ADD1.

For example, in response to the read command RD3 transmitted from the memory controller 1100, the driving voltage VDD may be first applied to the word lines of the prioritized memory block BLKa. Afterwards, voltages for performing the read operation may be respectively applied to the word lines of the memory block BLKa. The nonvolatile memory device 1200 may transmit the output data DOUT to the memory controller 1100.

To apply the driving voltage VDD to word lines of normal memory blocks, the memory controller 1100 may transmit a read command RD5, an address ADD3, and a read command RD6. The read command RD5 may be different from the read command RD1 or the read command RD3, and the read command RD6 may be different from the read command RD2 or the read command RD4. The address ADD3 may include a physical address of a normal memory block. In response to the read commands RD5 and RD6 and the address ADD3 received from the memory controller 1100, the nonvolatile memory device 1200 may charge word lines of normal memory blocks with the driving voltage VDD.

Figure 9:
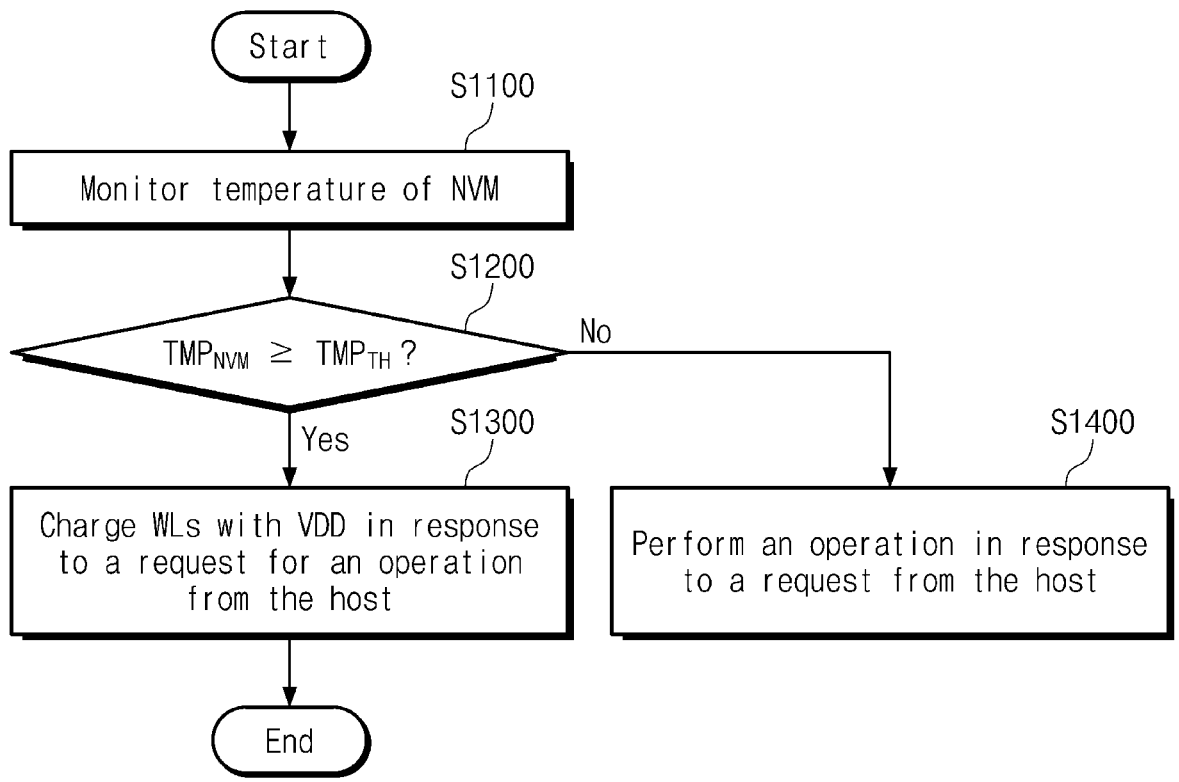
FIG. 9 is a flowchart illustrating an operation of a storage device of FIG. 1, according to an embodiment of the present disclosure.

FIG. 9 is a flowchart illustrating an operation of a storage device of FIG. 1, according to an embodiment of the present disclosure. Referring to FIGS. 1 and 9, the storage device 1000 may perform operation S1100 to operation S1300.

In operation S1100, the storage device 1000 may monitor a temperature of the nonvolatile memory device 1200. For example, the memory controller 1100 of the storage device 1000 may periodically monitor a temperature of the nonvolatile memory device 1200 by using the sensor 1130. Alternatively, the memory controller 1100 may monitor a temperature of the nonvolatile memory device 1200 by using a sensor included in the nonvolatile memory device 1200.

The storage device 1000 may periodically monitor a temperature of the nonvolatile memory device 1200. For example, the storage device 1000 may measure a temperature of the nonvolatile memory device 1200 every minute. A period at which a temperature of the nonvolatile memory device 1200 is measured may be variable. In some embodiments, as a temperature of the nonvolatile memory device 1200 increases, a period at which a temperature of the nonvolatile memory device 1200 is measured may become shorter.

In operation S1200, the storage device 1000 may compare the measured temperature of the nonvolatile memory device 1200 with a threshold temperature. When the measured temperature of the nonvolatile memory device 1200 is equal to or higher than the threshold temperature, the storage device 1000 may perform operation S1300. If not, the storage device 1000 may perform operation S1400. In operation S1400, the storage device 1000 may perform an operation in response to a request received from the external host. In some embodiments, the threshold temperature may be determined based on various factors such as a simulation result, a manufacturing process of the nonvolatile memory device 1200, or a request of the external host.

In operation S1300, the storage device 1000 may charge at least a part of word lines with the driving voltage VDD in response to a request for an operation received from the external host. The memory controller 1100 may prioritize a target memory block of the request received from the external host or may check a value of a flag of the target memory block. As in the manner described with reference to FIG. 7 or the manner described with reference to FIG. 8, under control of the memory controller 1100, at least a part of word lines of the nonvolatile memory device 1200 may be charged with the driving voltage VDD.

Figure 10:
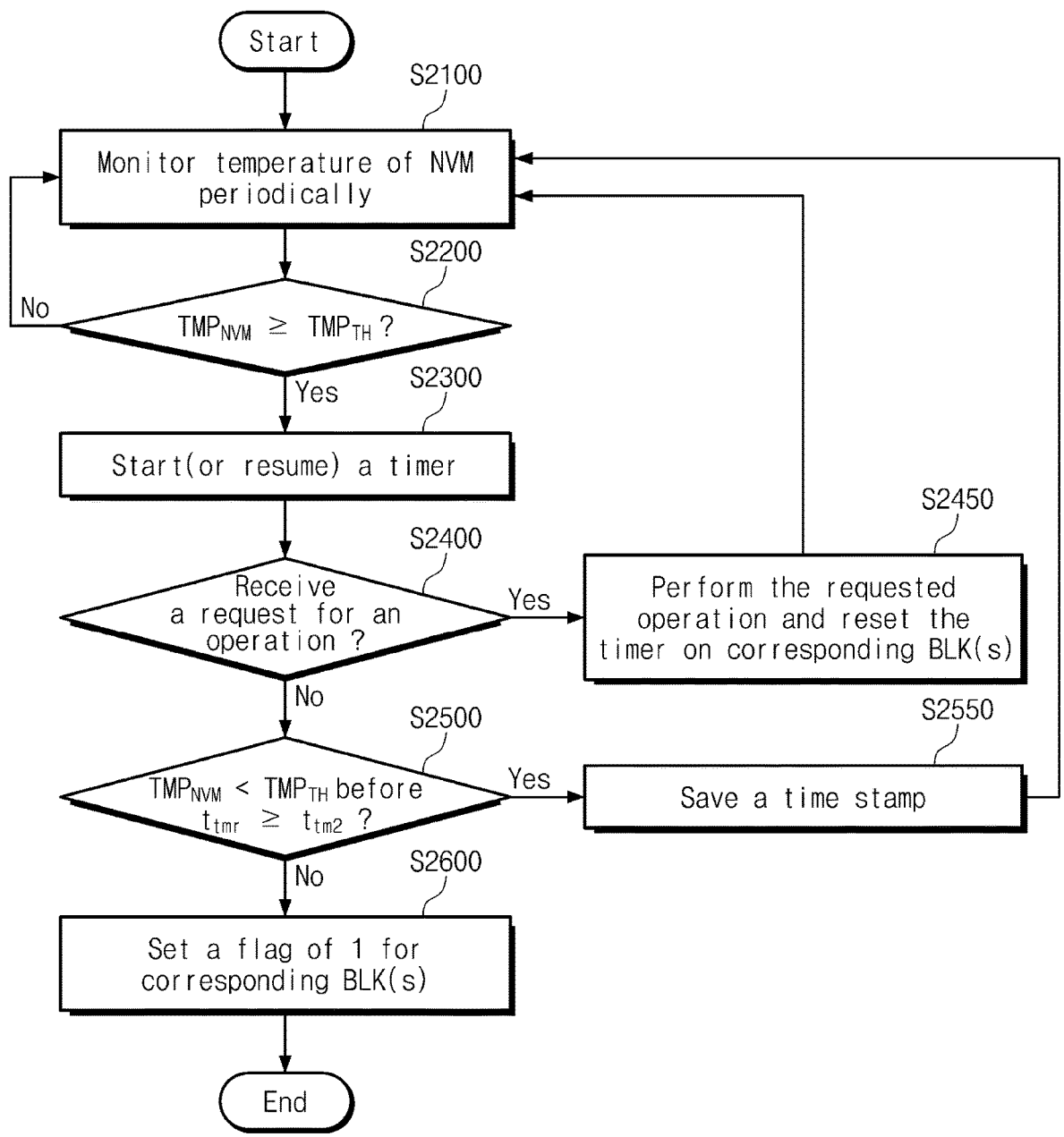
FIG. 10 is a flowchart illustrating an operation of setting a flag to a memory block, according to an embodiment of the present disclosure.

FIG. 10 is a flowchart illustrating an operation of setting a flag to a memory block, according to an embodiment of the present disclosure. Referring to FIGS. 1, 9, and 10, the storage device 1000 may perform operation S2100 to operation S2600.

In operation S2100, the storage device 1000 may periodically monitor a temperature of the nonvolatile memory device 1200. For example, the memory controller of the storage device 1000 may perform operation S2100 in a manner similar to the manner in operation S1100 of FIG. 9.

In operation S2200, the storage device 1000 may determine whether the temperature of the nonvolatile memory device 1200 is equal to or higher than a threshold temperature. For example, the memory controller 1100 of the storage device 1000 may perform operation S2200 in a manner similar to the manner in operation S1200 of FIG. 9. When the temperature of the nonvolatile memory device 1200 is lower than the threshold temperature, the storage device 1000 may perform operation S2100. When the temperature of the nonvolatile memory device 1200 is the same as or higher than the threshold temperature, the storage device 1000 may perform operation S2300.

In operation S2300, the storage device 1000 may start or resume a timer. For example, the memory controller 1100 of the storage device 1000 may start the timer for the purpose of determining whether the temperature of the nonvolatile memory device 1200 is maintained as much as a second threshold time period at the threshold temperature or higher. In some embodiments, the storage device 1000 may store a time stamp associated with the nonvolatile memory device 1200. In this case, the memory controller 1100 may resume the timer from a suspended point in time, based on the stored time stamp.

In operation S2400, the storage device 1000 may determine whether a request for performing an operation is received from the external host. For example, after starting the timer, the memory controller 1100 may receive a request for accessing the nonvolatile memory device 1200 from the external host. In this case, the memory controller 1100 performs operation S2450. After the timer is started (or resumed), when a request for accessing the nonvolatile memory device 1200 is not received from the external host, the memory controller 1100 may perform operation S2500.

In operation S2450, the storage device 1000 may perform the requested operation and may reset the timer with regard to memory blocks corresponding to the request. For example, the memory controller 1100 may allow the nonvolatile memory device 1200 to perform an operation of the request received in operation S2400. Afterwards, the memory controller 1100 may stop the timer with regard to a target memory block(s) where the operation is performed and may initialize the timer. After performing operation S2450, the storage device 1000 may perform operation S2100.

In operation S2500, the storage device 1000 may determine whether the temperature of the nonvolatile memory device 1200 is lower than the threshold temperature before the time period measured by the timer reaches the second threshold time period. For example, even after the timer is started, the memory controller 1100 may periodically monitor the temperature of the nonvolatile memory device 1200. When the temperature of the nonvolatile memory device 1200 is lower than the threshold temperature before the time period measured by the timer reaches the second threshold time period, the storage device 1000 may perform operation S2550. When it is determined, by using the timer, that the temperature of the nonvolatile memory device 1200 is maintained at the threshold temperature or higher for the second threshold time period or longer, the storage device 1000 may perform operation S2600.

In operation S2550, the storage device 1000 may store a time stamp. For example, the memory controller 1100 of the storage device 1000 may store, as the time stamp, a time of the timer at which the temperature of the nonvolatile memory device 1200 is lower than the threshold temperature. By using the stored time stamp, the storage device 1000 may resume the timer when the temperature of the nonvolatile memory device 1200 increases to the threshold temperature or higher. The storage device 1000 may store the time stamp and may return to operation S2100.

In operation S2600, the storage device 1000 may set the flag of the first value to a memory block(s) corresponding to a determination result in operation S2500. As operation S2100 to operation S2600 are performed, when the nonvolatile memory device 1200 is maintained at a temperature of the threshold temperature or higher for the second threshold time period or longer, the flag of the first value may be set to memory blocks that are not accessed for a given time.

Figure 11:
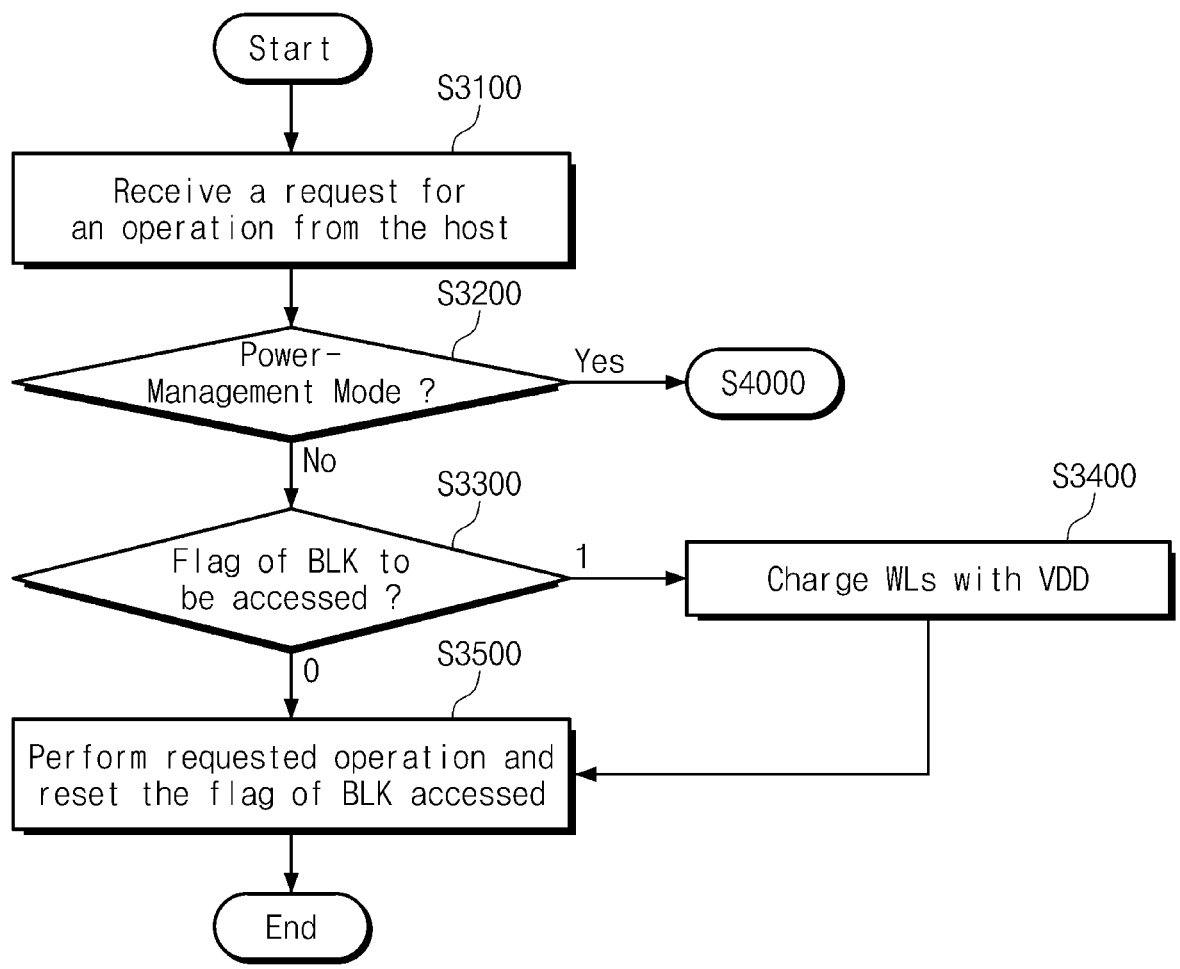
FIG. 11 is a flowchart illustrating an operation of the storage device 1000 performed in response to a request received from an external host in more detail according to example embodiments.

FIG. 11 is a flowchart illustrating an operation of the storage device 1000 performed in response to a request received from an external host in more detail according to example embodiments. Referring to FIGS. 1 and 9 to 11, the storage device 1000 may perform operation S3100 to operation S3500.

In operation S3100, the storage device 1000 may receive a request for an operation for the external host. For example, the external host may request the memory controller 1100 of the storage device 1000 to perform operations, such as the read operation, the write operation, or the erase operation, on the nonvolatile memory device 1200.

In operation S3200, the storage device 1000 may determine whether the nonvolatile memory device 1200 is in a power management mode. For example, the memory controller 1100 of the storage device 1000 may determine whether a power is being supplied to the nonvolatile memory device 1200. When it is determined that the power is being supplied to the nonvolatile memory device 1200, the memory controller 1100 may determine that the nonvolatile memory device 1200 is not in the power management mode. When it is determined that the power to the nonvolatile memory device 1200 is interrupted, the memory controller 1100 may determine that the nonvolatile memory device 1200 is in the power management mode.

When the nonvolatile memory device 1200 is not in the power management mode, the storage device 1000 may perform operation S3300. When the nonvolatile memory device 1200 is in the power management mode, the storage device 1000 may perform operation S4000.

In operation S3300, the storage device 1000 may check a flag set to a memory block to be accessed, in response to the request received in operation S3100. When it is determined that the flag of the memory block is set to the first value (in the embodiment illustrated in FIG. 11, "1"), the storage device 1000 may perform operation S3400. When it is determined that the flag of the memory block is set to the second value (in the embodiment illustrated in FIG. 11, "0"), the storage device 1000 may perform operation S3500.

In operation S3400, the storage device 1000 may first charge word lines of the memory block to be accessed among the nonvolatile memory device 1200 with the driving voltage VDD. For example, the memory controller 1100 of the storage device 1000 may allow the nonvolatile memory device 1200 to charge the word lines of the memory block corresponding to the request in operation S3100 with the driving voltage VDD.

In operation S3500, the storage device 1000 may perform the requested operation and may reset the flag of the accessed memory block. For example, the memory controller 1100 of the storage device 1000 may allow the nonvolatile memory device 1200 to perform an operation corresponding to the request received in operation S3100. Afterwards, the memory controller 1100 may reset the flag of the accessed memory block. For example, in the case where the flag of the accessed memory block has the first value, the memory controller 1100 may set the flag of the accessed memory block to the second value. In the case where the flag of the accessed memory block has the second value, the memory controller 1100 may not change the flag of the accessed memory block of the second value.

Figure 12:
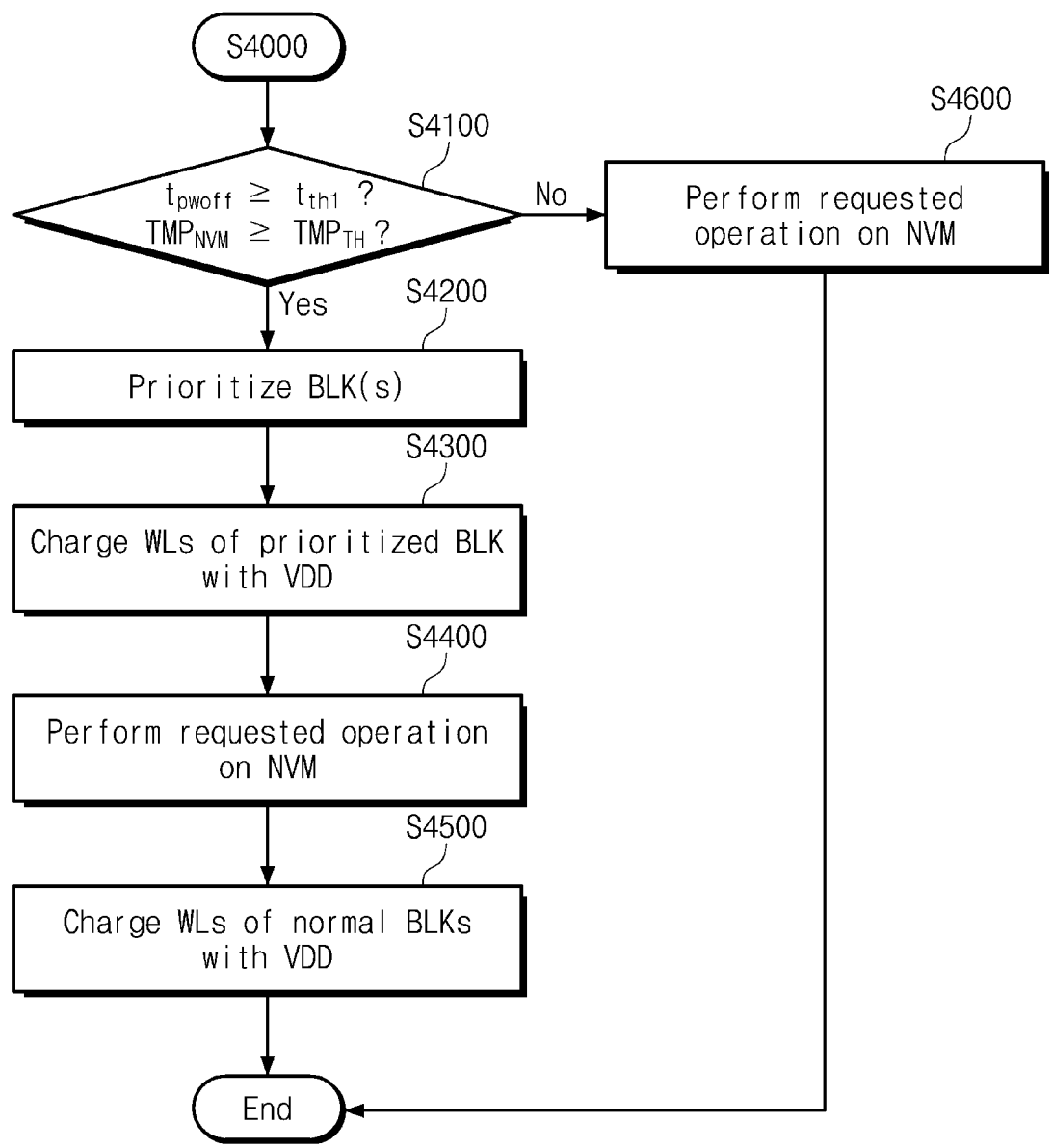
FIG. 12 is a flowchart illustrating an operation of a storage device of FIG. 1 in more detail, according to another embodiment of the present disclosure.

FIG. 12 is a flowchart illustrating an operation of a storage device of FIG. 1 in more detail, according to another embodiment of the present disclosure. Referring to FIGS. 1 and 9 to 12, in response to the determination in operation S3200 of FIG. 11 indicating that the nonvolatile memory device 1200 is in the power management mode, the storage device 1000 may perform operation S4100 to operation S4600.

In operation S4100, the storage device 1000 may determine whether a time period for which a power of the nonvolatile memory device 1200 is interrupted is equal to or longer than the first threshold time period and whether a temperature of the nonvolatile memory device 1200 is equal to or higher than the threshold temperature. For example, in response to the request received in operation S3100 of FIG. 11, the memory controller 1100 may supply a power to the nonvolatile memory device 1200 and may check a time period for which the power of the nonvolatile memory device 1200 is interrupted. When it is determined that the power of the nonvolatile memory device 1200 is interrupted for a time period equal to or longer than the first threshold time period and the temperature of the nonvolatile memory device 1200 is equal to or higher than the threshold temperature, the storage device 1000 may perform operation S4200. If not, the storage device 1000 may perform operation S4600. In operation S4600, the storage device 1000 may perform an operation requested in operation S3100 of FIG. 11.

In some embodiments, in operation S4600, the storage device 1000 may check a flag set to a memory block to be accessed. When it is determined that the flag of the memory block is set to the first value, the storage device 1000 may charge word lines of the memory block to be accessed with the driving voltage VDD and may then perform the requested operation. When it is determined that the flag of the memory block is set to the second value, the storage device 1000 may immediately perform the requested operation.

In operation S4200, the storage device 1000 may prioritize at least a part of the memory blocks BLK1 to BLKz of the nonvolatile memory device 1200. For example, the memory controller 1100 of the storage device 1000 may prioritize a memory block(s) corresponding to the request received in operation S3100 of FIG. 11.

In operation S4300, the storage device 1000 may charge word lines of the prioritized memory block(s) with the driving voltage VDD. In operation S4400, the storage device 1000 may perform the operation requested in operation S3100 of FIG. 11 on the nonvolatile memory device 1200. In operation S4500, the storage device 1000 may charge word lines of a normal memory block(s), which are not prioritized, with the driving voltage VDD.

As operation S4100 to operation S4500 are performed, a time necessary to perform a wake-up operation of the nonvolatile memory device 1200 may not unnecessarily increase. For example, instead of simultaneously charging word lines of all the memory blocks BLK1 to BLKz with the driving voltage VDD, the storage device 1000 may first charge word lines of some memory blocks with the driving voltage VDD, may perform an operation requested by the external host, and may then charge word lines of the remaining memory blocks with the driving voltage VDD. Because only a small number of word lines are charged with the driving voltage VDD and a requested operation is performed, an additional time required due to the charging of word lines with the driving voltage VDD may be reduced.

Figure 13:
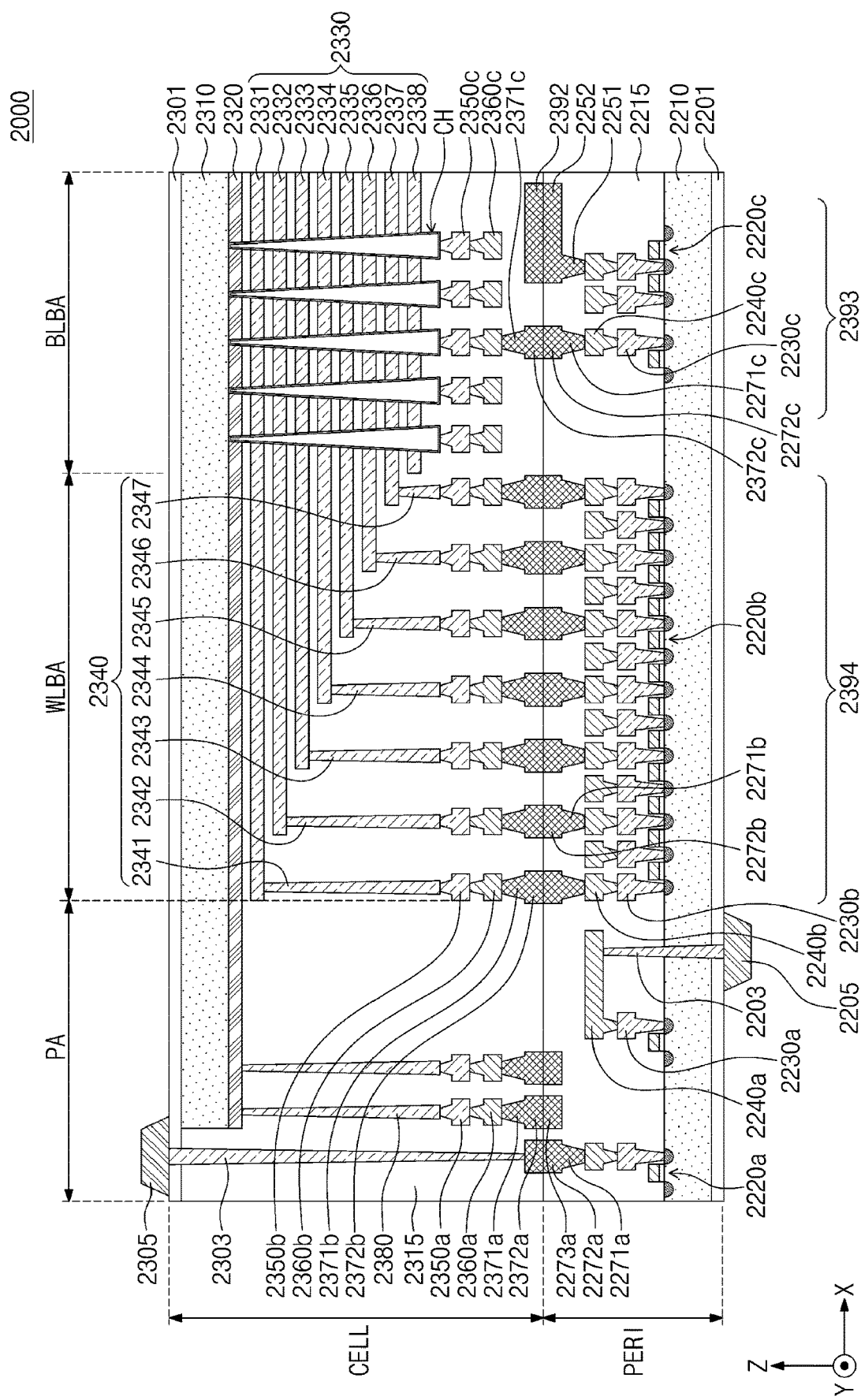
FIG. 13 is a cross-sectional view illustrating a nonvolatile memory device of FIG. 1 according to example embodiments.

FIG. 13 is a cross-sectional view illustrating a memory device 2000 according to example embodiments.

Referring to FIG. 13, a memory device 2000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220*a*, 2220*b*, and 2220*c* formed on the first substrate 2210, first metal layers 2230*a*, 2230*b*, and 2230*c* respectively connected to the plurality of circuit elements 2220*a*, 2220*b*, and 2220*c*, and second metal layers 2240*a*, 2240*b*, and 2240*c* formed on the first metal layers 2230*a*, 2230*b*, and 2230*c*. Each of the circuit elements 2220*a*, 2220*b*, and 2220*c* may include one or more transistors. In an example embodiment, the first metal layers 2230*a*, 2230*b*, and 2230*c* may be formed of tungsten having relatively high electrical resistivity, and the second metal layers 2240*a*, 2240*b*, and 2240*c* may be formed of copper having relatively low electrical resistivity.

In an example embodiment illustrate in FIG. 13, although only the first metal layers 2230*a*, 2230*b*, and 2230*c* and the second metal layers 2240*a*, 2240*b*, and 2240*c* are shown and described, the example embodiment is not limited thereto, and one or more additional metal layers may be further formed on the second metal layers 2240*a*, 2240*b*, and 2240*c*. At least a portion of the one or more additional metal layers formed on the second metal layers 2240*a*, 2240*b*, and 2240*c* may be formed of aluminum or the like having a lower electrical resistivity than those of copper forming the second metal layers 2240*a*, 2240*b*, and 2240*c*.

The interlayer insulating layer 2215 may be disposed on the first substrate 2210 and cover the plurality of circuit elements 2220*a*, 2220*b*, and 2220*c*, the first metal layers 2230*a*, 2230*b*, and 2230*c*, and the second metal layers 2240*a*, 2240*b*, and 2240*c*. The interlayer insulating layer 2215 may include an insulating material such as silicon oxide, silicon nitride, or the like.

Lower bonding metals 2271*b* and 2272*b* may be formed on the second metal layer 2240*b* in the word line bonding area WLBA. In the word line bonding area WLBA, the lower bonding metals 22*r*1*b* and 2272*b* in the peripheral circuit region PERI may be electrically bonded to upper bonding metals 2371*b* and 2372*b* of the cell region CELL. The lower bonding metals 2271*b* and 2272*b* and the upper bonding metals 2371*b* and 2372*b* may be formed of aluminum, copper, tungsten, or the like. Further, the upper bonding metals 2371*b* and 2372*b* in the cell region CELL may be referred as first metal pads and the lower bonding metals 2271*b* and 2272*b* in the peripheral circuit region PERI may be referred as second metal pads.

The cell region CELL may include at least one memory block. The cell region CELL may include a second substrate 2310, an interlayer insulating layer 2315 and a common source line 2320. On the second substrate 2310, a plurality of word lines 2331 to 2338 (i.e., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

In the bit line bonding area BLBA, a channel structure CH may extend in a direction (a Z-axis direction), perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a first metal layer 2350*c* and a second metal layer 2360*c*. For example, the first metal layer 2350*c* may be a bit line contact, and the second metal layer 2360*c* may be a bit line. In an example embodiment, the bit line 2360*c* may extend in a first direction (a Y-axis direction), parallel to the upper surface of the second substrate 2310.

The interlayer insulating layer 2315 may be disposed on the second substrate 2310 to cover the common source line 2320, the plurality of word lines 2330, a plurality of cell contact plugs 2340, first metal layers 2350*a*, 2350*b*, and 2350*c*, and second metal layers 2360*a*, 2360*b*, and 2360*c*. The interlayer insulating layer 2315 may include an insulating material such as silicon oxide, silicon nitride, or the like.

In an example embodiment illustrated in FIG. 13, an area in which the channel structure CH, the bit line 2360*c*, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. The bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393. In an example embodiment, a program operation may be executed based on a page unit as write data of the page-unit is stored in the page buffer 2393, and a read operation may be executed based on a sub-page unit as read data of the sub-page unit is stored in the page buffer 2393. Also, in the program operation and the read operation, units of data transmitted through bit lines may be different from each other.

In the word line bonding area WLBA, the plurality of word lines 2330 may extend in a second direction (an X-axis direction), parallel to the upper surface of the second substrate 2310 and perpendicular to the first direction, and may be connected to a plurality of cell contact plugs 2341 to 2347 (i.e., 2340). The plurality of word lines 2330 and the plurality of cell contact plugs 2340 may be connected to each other in pads provided by at least a portion of the plurality of word lines 2330 extending in different lengths in the second direction. A first metal layer 2350b and a second metal layer 2360b may be connected to an upper portion of the plurality of cell contact plugs 2340 connected to the plurality of word lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b of the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input-output pads 2205 and 2305 may be disposed in the external pad bonding area PA. Referring to FIG. 13, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 13, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303. In the example embodiment, the second input-output pad 2305 is electrically connected to a circuit element 2220a.

According to embodiments, the second substrate 2310 and the common source line 2320 may not be disposed in an area in which the second input-output contact plug 2303 is disposed. Also, the second input-output pad 2305 may not overlap the word lines 2330 in the third direction (the Z-axis direction). Referring to FIG. 13, the second input-output contact plug 303 may be separated from the second substrate 2310 in a direction, parallel to the upper surface of the second substrate 2310, and may pass through the interlayer insulating layer 2315 of the cell region CELL to be connected to the second input-output pad 2305.

According to embodiments, the first input-output pad 2205 and the second input-output pad 2305 may be selectively formed. For example, the memory device 600 may include only the first input-output pad 2205 disposed on the first substrate 2210 or the second input-output pad 2305 disposed on the second substrate 2310. Alternatively, the memory device 600 may include both the first input-output pad 2205 and the second input-output pad 2305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 600 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In example embodiments, the memory device 2000 may correspond to the nonvolatile memory device 1200 described with reference to FIGS. 1 and 2. In an embodiment, a memory cell array or a memory block described with reference to FIGS. 2 and 3 may be included in the cell region CELL. Peripheral circuits (e.g., the row decoder circuit 1220, the page buffer circuit 1230, the data input/output circuit 1240, and the control logic circuit 1250) described with reference to FIG. 2 may be included in the peripheral circuit region PERI.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

According to some embodiments of the present disclosure, when a selected memory block of a nonvolatile memory device is exposed to a temperature of a threshold temperature or higher for a second threshold time period or longer or when a power of the nonvolatile memory device is interrupted for a given time and the selected memory block is exposed to a temperature of the threshold temperature or higher, word lines of the selected memory block may be charged with a driving voltage, and the selected memory block may be accessed.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An operating method of a storage device, the method comprising:
monitoring, by the storage device, a temperature of a nonvolatile memory device including a plurality of memory blocks;
detecting a first condition that indicates a first memory block from among the plurality of memory blocks is being exposed at a temperature of a threshold temperature or higher for a first time period that is equal to or greater than a threshold time period;
detecting a second condition that indicates the first memory block is being exposed at a temperature less than the threshold temperature for the threshold time period;
receiving, by the storage device, a first request from a host; and
in response to the first request;
transmitting, by the storage device, a first command associated with the first condition to the nonvolatile memory device,
in response to the first command, performing, by the storage device, a first operation corresponding to the first re quest on the first memory block with charging a plurality of first word lines of the first memory block with a driving voltage,
transmitting, by the storage device, a second command associated with the second condition to the nonvolatile memory device,
and
in response to the second command performing, by the storage device, the first operation corresponding to the first request on the first memory block without charging the plurality of the first word lines of the first memory block.

2. The method of claim 1, wherein the monitoring of the temperature of the nonvolatile memory device includes:
monitoring the temperature of the nonvolatile memory device at a first period, and
wherein the first period is variable based on the temperature of the nonvolatile memory device.

3. The method of claim 2, wherein the first period decreases as the temperature of the nonvolatile memory device increases.

4. The method of claim 1, wherein the transmitting of the first command and the second command to the nonvolatile memory device includes:
setting a flag of a specific value to the first memory block when the first memory block is exposed at the temperature of the threshold temperature or higher for the first time period;
transmitting the first command to the nonvolatile memory device in response to the first request being received and the flag of the specific value being set to the first memory block; and
transmitting the second command to the nonvolatile memory device in response to the first request being received and the flag of the specific value being not set to the first memory block.

5. The method of claim 1, wherein the monitoring of the temperature of the nonvolatile memory device includes:
comparing the temperature of the nonvolatile memory device to the threshold temperature; and
operating a timer with respect to the plurality of memory blocks in response to the temperature of the nonvolatile memory device being equal to or higher than the threshold temperature.

6. The method of claim 5, wherein the monitoring of the temperature of the nonvolatile memory device further includes:
suspending a timer with respect to the plurality of memory blocks in response to the temperature of the nonvolatile memory device being lower than the threshold temperature; and
resuming the timer with respect to the plurality of memory blocks in response to the temperature of the nonvolatile memory device being again equal to or higher than the threshold temperature.

7. The method of claim 5, wherein the monitoring of the temperature of the nonvolatile memory device further includes:
setting a flag of a specific memory block of the plurality of memory blocks to a first value in response to a time period measured by the timer with respect to the specific memory block being equal to or longer than the threshold time period.

8. The method of claim 5, wherein the monitoring of the temperature of the nonvolatile memory device further includes:
receiving a second request associated with a second memory block from among the plurality of memory blocks from the host when a time period measured by the timer is less than the threshold time period;

performing a second operation corresponding to the second request; and resetting the timer with respect to the second memory block.

9. An operating method of a storage device, the method comprising:

receiving, by the storage device, a first request from a host;

interrupting, by the storage device, a power supplied to a nonvolatile memory device including a plurality of memory blocks in response to the first request;

detecting a first condition that indicates the nonvolatile memory device is being interrupted for a time period that is equal to or greater than a first threshold time period;

detecting a second condition that indicated the nonvolatile memory device is being interrupted for a time period less than the first threshold time period;

receiving, by the storage device, a second request from the host;

supplying, by the storage device, the power to the nonvolatile memory device in response to the second request;

in response to the second request;

transmitting, by the storage device, a first command associated with the first condition to the nonvolatile memory device, in response to the first command, performing, by the storage device, an operation corresponding to the second request on a first memory block from among the plurality of memory blocks with charging a plurality of first word lines of the first memory block with a driving voltage, transmitting, by the storage device, a second command associated with the second condition to the nonvolatile memory device, and in response to the second command, performing, by the storage device, the operation corresponding to the second request on the first memory block without charging the plurality of first word lines of the first memory block.

10. The method of claim 9, wherein the interrupting of the power supplied to the nonvolatile memory device includes:

operating a timer in response to the first request; and transmitting a third command associated with a second memory block from among the plurality of memory blocks to the nonvolatile memory device in response to transmitting the first command.

11. The method of claim 10, further comprising:

charging a plurality of second word lines of the second memory block with the driving voltage in response to the third command.

12. The method of claim 10, wherein the transmitting of the first command and the second command to the nonvolatile memory device includes;

setting a flag of a first value to the first memory block when the first memory block is exposed at a temperature of a threshold temperature or higher for a period that is equal to or greater than a second threshold time period;

transmitting the first command to the nonvolatile memory device in response to the second request being received and the flag of the first value being set to the first memory block; and transmitting the second command to the nonvolatile memory device in response to the second request being received and the flag of the first value being not set to the first memory block.

13. The method of claim 12, further comprising:

monitoring a temperature of the nonvolatile memory device periodically, wherein the monitoring of the temperature of the nonvolatile memory device periodically includes:

comparing the temperature of the nonvolatile memory device to the threshold temperature; and operating a timer with respect to the plurality of memory blocks in response to the temperature of the nonvolatile memory device being equal to or higher than the threshold temperature.

14. The method of claim 13, wherein the monitoring of the temperature of the nonvolatile memory device includes:

suspending the timer with respect to the plurality of memory blocks in response to the temperature of the nonvolatile memory device being lower than the threshold temperature; and resuming the timer with respect to the plurality of memory blocks in response to the temperature of the nonvolatile memory device being again the same as or higher than the threshold temperature; and setting a flag of a specific memory block of the plurality of memory blocks to a first value in response to a time period measured by the timer with respect to the specific memory block being equal to or longer than the second threshold time period.

15. The method of claim 12, wherein the performing of the operation corresponding to the second request on the first memory block in response to the first command or the second command includes:

setting the flag of the first memory block to a second value.

16. A storage device comprising:

a nonvolatile memory device including a plurality of memory blocks; and a memory controller configured to:

in response to a first request received from a host, interrupt a power supplied to the nonvolatile memory device; and in response to a second request received from the host, transmit:

a first command to the nonvolatile memory device when the power supplied to the nonvolatile memory device is interrupted for a first time period that is equal to or greater than a first threshold time period, and a second command to the nonvolatile memory device when the power supplied to the nonvolatile memory device is interrupted for a time period less than the first threshold time period, wherein the nonvolatile memory device is configured to:

charge word lines of a first memory block corresponding the second request with a driving voltage in response to the first command; and perform a first operation corresponding to the second request in response to the first command or the second command.

17. The storage device of claim 16, wherein the nonvolatile memory device includes:

a memory cell region including a first metal pad and a memory cell array; and a peripheral circuit region including a second metal pad and vertically connected to the memory cell region by the first metal pad and the second metal pad, wherein the memory cell array includes the plurality of memory blocks, and each of the plurality of memory blocks includes cell strings including memory cells, word lines connected to the memory cells, bit lines connected to the cell strings, and a ground selection line connected to the cell strings.

18. The storage device of claim 16, wherein the memory controller is further configured to:
   monitor a temperature of the nonvolatile memory device periodically;
   compare the temperature of the nonvolatile memory device to a threshold temperature;
   operate a timer with respect to the plurality of memory blocks in response to the temperature of the nonvolatile memory device being equal to or higher than the threshold temperature;
   suspend the timer with respect to the plurality of memory blocks in response to the temperature of the nonvolatile memory device being lower than the threshold temperature;
   resume the timer with respect to the plurality of memory blocks in response to the temperature of the nonvolatile memory device being again equal to or higher than the threshold temperature; and
   set a flag of a specific memory block of the plurality of memory blocks to a first value in response to a time period measured by the timer with respect to the specific memory block being equal to or longer than a second threshold time period.

19. The storage device of claim 18, wherein the memory controller is further configured to:
   transmit the first command to the nonvolatile memory device in response to a flag of the first memory block being set to the first value; and
   set the flag of the first memory block to a second value, and
   wherein the second command is associated with the second value.

20. The storage device of claim 16, wherein the memory controller is further configured to:
   again supply the power to the nonvolatile memory device in response to a third request received from the host; and
   in response to the third request, transmit:
   a third command to the nonvolatile memory device when a temperature of the nonvolatile memory device is a threshold temperature or higher and the power to the nonvolatile memory device is interrupted for the first threshold time period, and
   the second command to the nonvolatile memory device when the temperature of the nonvolatile memory device is less than the threshold temperature and the power to the nonvolatile memory device is interrupted for a time period less than the first threshold time period, and
   wherein, in response to the third command, the nonvolatile memory device is configured to:
   charge word lines of a second memory block corresponding to the third command from among the plurality of memory blocks with the driving voltage;
   perform an operation corresponding to the third request; and
   charge word lines of the remaining memory blocks of the plurality of memory blocks other than the second memory block with the driving voltage.

* * * * *